US008837203B2

(12) United States Patent
Shionoiri et al.

(10) Patent No.: US 8,837,203 B2
(45) Date of Patent: Sep. 16, 2014

(54) SEMICONDUCTOR DEVICE

(75) Inventors: Yutaka Shionoiri, Isehara (JP);
Hidetomo Kobayashi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 157 days.

(21) Appl. No.: 13/467,490

(22) Filed: May 9, 2012

(65) Prior Publication Data
US 2012/0292613 A1 Nov. 22, 2012

(30) Foreign Application Priority Data

May 19, 2011 (JP) ................................. 2011-112797

(51) Int. Cl.
 *G11C 11/24* (2006.01)
 *H01L 27/105* (2006.01)
 *H01L 21/84* (2006.01)
 *H01L 27/12* (2006.01)
 *G11C 11/00* (2006.01)
 *H01L 27/115* (2006.01)
 *H01L 27/108* (2006.01)

(52) U.S. Cl.
 CPC ....... *H01L 27/1156* (2013.01); *H01L 27/10873* (2013.01); *H01L 27/1052* (2013.01); *H01L 27/10897* (2013.01); *H01L 21/84* (2013.01); *H01L 27/1203* (2013.01); *G11C 11/005* (2013.01); *H01L 27/1225* (2013.01); *H01L 27/11526* (2013.01)
 USPC ............ 365/149; 365/129; 365/154; 365/174

(58) Field of Classification Search
 USPC .................................. 365/129, 149, 154, 174
 See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Fernando Hidalgo
(74) *Attorney, Agent, or Firm* — Eric J. Robinson; Robinson Intellectual Property Law Office, P.C.

(57) ABSTRACT

The data in a volatile memory may conventionally be lost even in case of a very short time power down or supply voltage drop such as an outage or sag. In view of the foregoing, an object is to extend data retention time even with a volatile memory for high-speed data processing. Data retention time can be extended by backing up the data content stored in the volatile memory in a memory including a capacitor and an oxide semiconductor transistor.

14 Claims, 18 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,130,234 B2 | 10/2006 | Shionoiri et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,410,838 B2 | 4/2013 | Kato et al. |
| 8,432,187 B2 | 4/2013 | Kato et al. |
| 8,575,985 B2 | 11/2013 | Ohmaru et al. |
| 8,593,856 B2 | 11/2013 | Koyama et al. |
| 8,618,586 B2 | 12/2013 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0164834 A1* | 6/2009 | Tang ................................ 714/2 |
| 2009/0244954 A1* | 10/2009 | Cannon et al. ................ 365/149 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0133292 A1* | 6/2011 | Lee et al. ....................... 257/401 |
| 2011/0260158 A1* | 10/2011 | Takemura ....................... 257/43 |
| 2012/0257440 A1 | 10/2012 | Takemura |
| 2012/0268164 A1 | 10/2012 | Kobayashi et al. |
| 2012/0269013 A1 | 10/2012 | Matsuzaki |
| 2012/0314524 A1 | 12/2012 | Takemura |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-196949 | 7/2005 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Disgest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMo3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Display,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1982, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

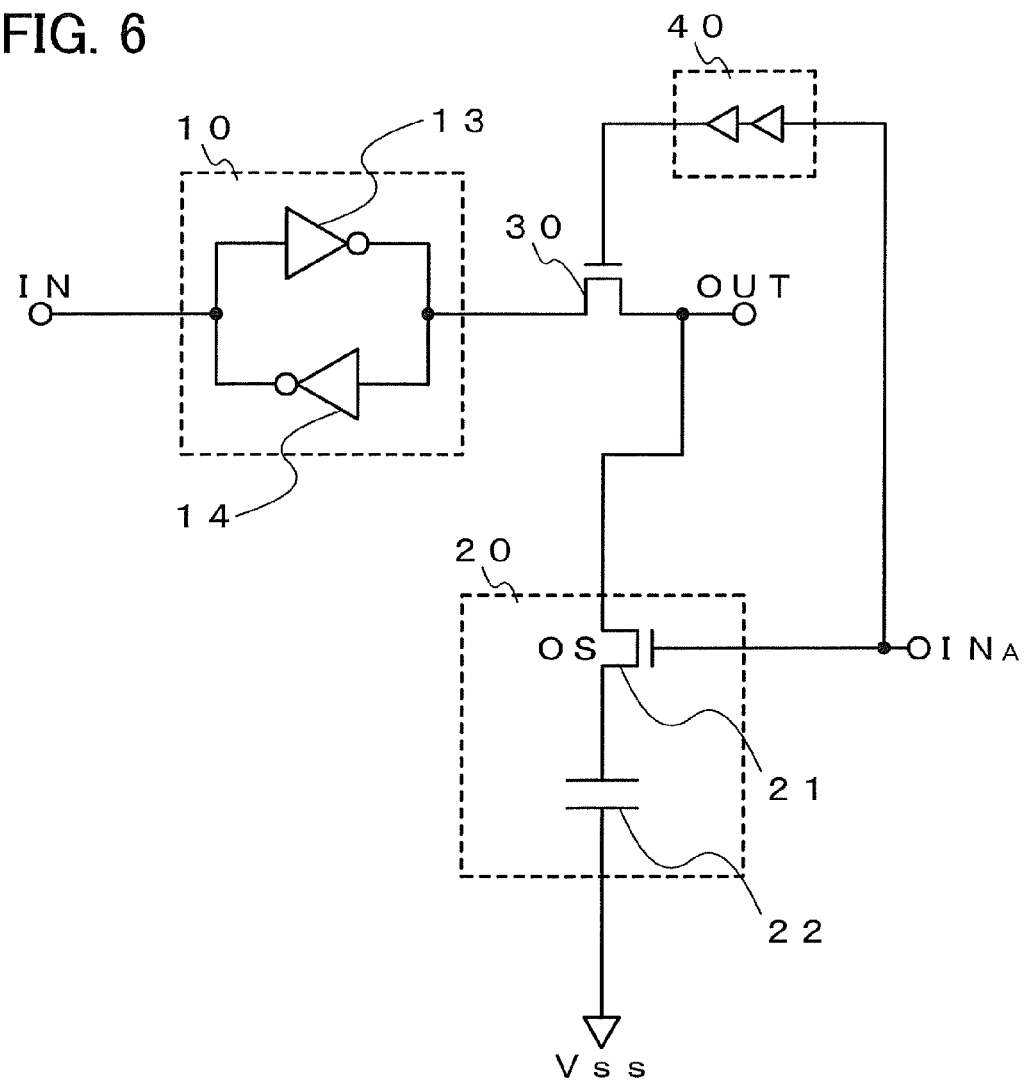

SEMICONDUCTOR DEVICE

BACKGROUND OF THE INVENTION

1. Field of the Invention

The field of the invention relates to a semiconductor device including a memory.

2. Description of the Related Art

Patent Document 1 discloses a semiconductor device including a memory such as an SRAM or DRAM.

REFERENCE

Patent Document

[Patent Document 1] Japanese Published Patent Application No. 2005-196949

SUMMARY OF THE INVENTION

Volatile memories (e.g., SRAM and DRAM) are suitable for high-speed data processing.

However, in a volatile memory, the data content is lost in case of power down.

An SRAM, for example, does not include a charge storage element (e.g., a capacitor); thus, the data therein is lost in case of power down.

A DRAM includes a capacitor which is a type of charge storage elements. However, silicon transistors used in DRAMs in common use have a high leakage current between the source and the drain. Thus, the electric charge stored in the capacitor is lost in a very short time.

In other words, even in a DRAM, the data content is lost in a very short time.

For this reason, the data in a volatile memory may conventionally be lost even in case of a very short time power down or supply voltage drop such as an outage or sag.

The following discloses a structure that can extend data retention time even with a volatile memory for high-speed data processing.

An output port of a volatile memory is electrically connected to a memory including a capacitor and an oxide semiconductor transistor.

An oxide semiconductor has a much wider band gap than silicon.

The wider the band gap of a semiconductor for a transistor is, the lower the off-state current of the transistor becomes.

Therefore, a transistor with a channel formation region of an oxide semiconductor has a much lower leakage current between the source and the drain (transistor off-state current) than a transistor formed using a semiconductor including silicon.

In other words, the memory including a capacitor and an oxide semiconductor transistor has a much longer charge storage time (data retention time) than a volatile memory formed using a semiconductor including silicon.

Therefore, data retention time can be extended by backing up the data content stored in the volatile memory in the memory including a capacitor and an oxide semiconductor transistor.

The output of the volatile memory becomes unstable in case of power down, and an undefined potential (undefined voltage) may appear at the output port of the volatile memory.

In this case, data loss may occur during a restart operation owing to collision between the backed up data and the undefined potential (undefined voltage).

In view of the foregoing, a switch (data collision prevention switch) is provided between an output terminal and an output port of the volatile memory, preventing data from being lost owing to an undefined potential (undefined voltage) at the output port of the volatile memory.

Note that the volatile memory may be any element, but is preferably a transistor formed using a semiconductor including silicon which can be formed integrally with and over the same substrate as the oxide semiconductor transistor.

In other words, it is possible to provide a semiconductor device including a memory cell including a first and second input terminals, an output terminal, a volatile memory, a transistor, and a capacitor. An input port of the volatile memory is electrically connected to the first input terminal. An output port of the volatile memory is electrically connected to the output terminal. A gate of the transistor is electrically connected to the second input terminal. One of a source and a drain of the transistor is electrically connected to the output terminal. The other of the source and the drain of the transistor is electrically connected to the capacitor. An oxide semiconductor is used as a material for a semiconductor layer in the transistor.

Moreover, it is possible to provide a semiconductor device comprising a memory cell including a first and second input terminals, an output terminal, a volatile memory, a transistor, a capacitor, and a data collision prevention switch. An input port of the volatile memory is electrically connected to the first input terminal. An output port of the volatile memory is electrically connected to one terminal of the data collision prevention switch. The other terminal of the data collision prevention switch is electrically connected to the output terminal. A gate of the transistor is electrically connected to the second input terminal. One of a source and a drain of the transistor is electrically connected to the output terminal. The other of the source and the drain of the transistor is electrically connected to the capacitor. An oxide semiconductor is used as a material for a semiconductor layer in the transistor.

Moreover, it is possible to provide a semiconductor device in which an oxide semiconductor layer is used as a semiconductor layer in the data collision prevention switch, and the semiconductor layer in the transistor and the semiconductor layer in the data collision prevention switch are formed of a common layer.

Moreover, it is possible to provide a semiconductor device including a plurality of pipeline circuits, in which one or more of the memory cells are provided between stages in the plurality of pipeline circuits.

In this specification, "electrically connected" means "directly connected" or "connected via an element that does not affect circuit operation".

An element that does not affect circuit operation refers to an element that outputs, when receiving an input signal, a signal having the same content as the input signal, and when receiving an input voltage, a voltage having the same polarity as the input voltage. Specifically, such an element is a resistor, a switch, a diode, or the like. A switch is a transistor, for example. In the case where the input is a voltage, such an element may also be a capacitor, for example.

Data retention time can be extended by backing up the data content stored in the volatile memory in the memory including a capacitor and an oxide semiconductor transistor.

By providing a switch between the output terminal and the output of the volatile memory, data can be prevented from being lost owing to an undefined potential (undefined voltage) at the output of the volatile memory.

BRIEF DESCRIPTION OF THE DRAWINGS

FIG. 6 illustrates an example of a semiconductor device.

DETAILED DESCRIPTION OF THE INVENTION

Figure 1:
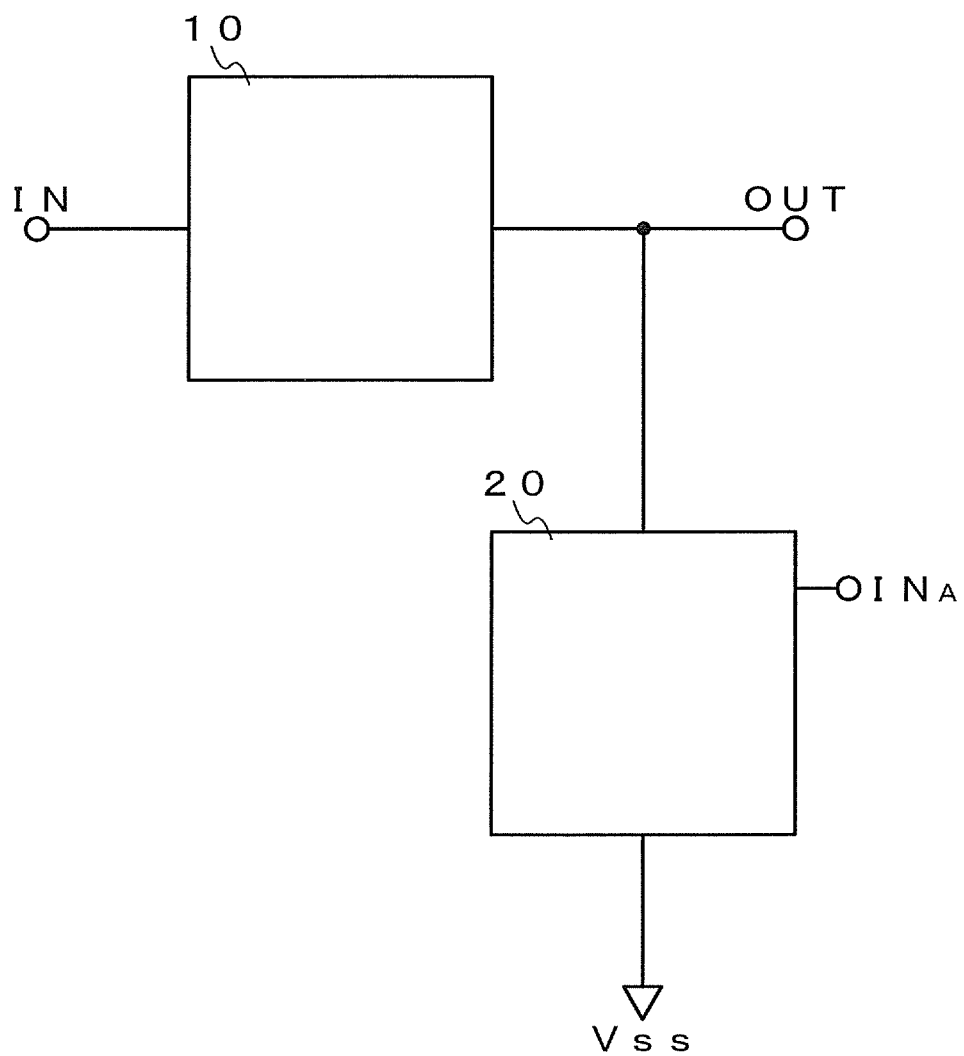
FIG. 1 illustrates an example of a semiconductor device.

Embodiments will be described with reference to the drawings.

It is easily understood by those skilled in the art that modes and details thereof can be modified in various ways without departing from the spirit and scope of the present invention.

Therefore, the present invention should not be interpreted as being limited to what is described in the embodiments described below.

In the structures to be given below, the same portions or portions having similar functions are denoted by the same reference numerals in different drawings, and explanation thereof will not be repeated.

The following embodiments can be implemented in combination as appropriate.

(Embodiment 1)

FIG. 1 illustrates an example of a semiconductor device provided with a memory cell including an input terminal IN, an output terminal OUT, a memory 10, and a memory 20.

The input terminal IN is electrically connected to an input port of the memory 10.

The output terminal OUT is electrically connected to an output port of the memory 10 and an input/output port of the memory 20. In the memory 20, a common terminal serves as an input port and an output port and is called "input/output port".

One terminal of the memory 20 is electrically connected to an input terminal $IN_A$, and the other terminal of the memory 20 is electrically connected to a power supply that supplies a low supply voltage Vss.

Note that the other terminal of the memory 20 may be electrically connected to a power supply that supplies a supply voltage Vdd instead.

The input terminal IN receives an input signal (input voltage) IN.

An output signal (output voltage) OUT is output from the output terminal OUT.

The input terminal $IN_A$ receives an input signal (input voltage) $IN_A$.

Note that the low supply voltage Vss is lower than the supply voltage Vdd.

The low supply voltage Vss includes a ground potential GND, but a reference potential is not always the ground potential GND.

The memory 10 is a volatile memory.

The volatile memory may be any element, e.g., a charge storage memory or a feedback loop memory.

A transistor used in the volatile memory is preferably a transistor formed using a semiconductor including silicon which can be formed integrally with an oxide semiconductor transistor.

The memory 20 includes at least a capacitor and an oxide semiconductor transistor.

Data retention time can be extended by backing up the data content stored in the memory 10, which is a volatile memory, in the memory 20 including a capacitor and an oxide semiconductor transistor.

The contents of this embodiment or part thereof can be implemented in combination with any of the other embodiments and examples.

(Embodiment 2)

Examples of the memory 10 and the memory 20 will be described.

Figure 2:
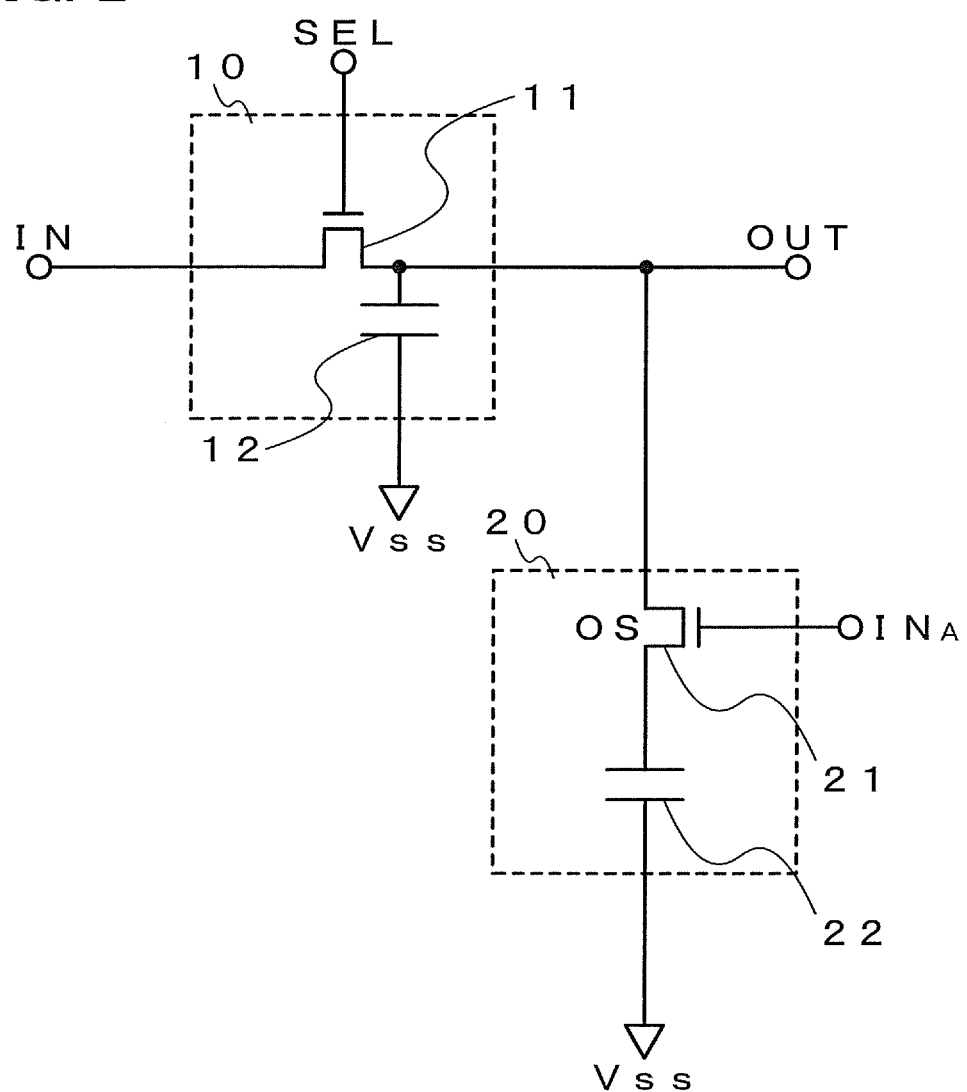
FIG. 2 illustrates an example of a semiconductor device.
Figure 3:
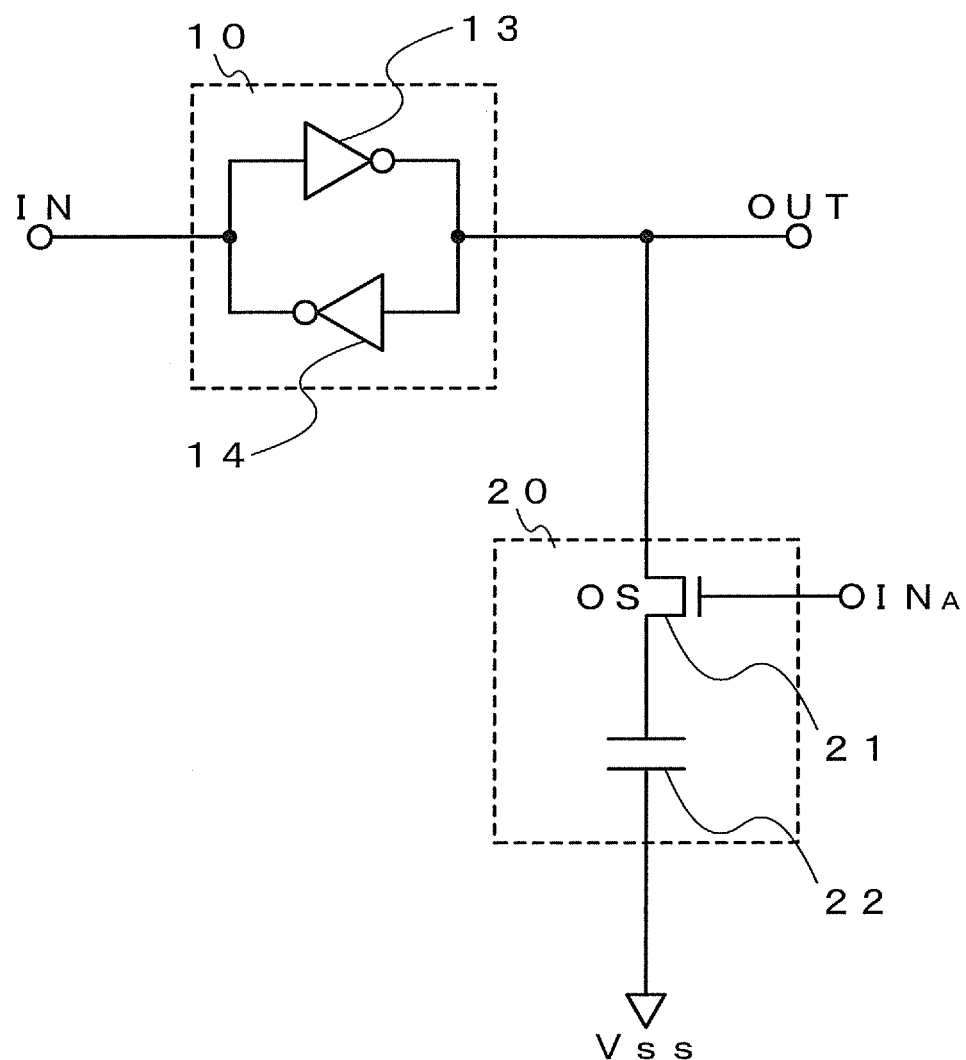
FIG. 3 illustrates an example of a semiconductor device.

FIG. 2 and FIG. 3 are diagrams illustrating, in detail, the memory 10 and the memory 20 in FIG. 1.

The memory 10 may be, for example, a memory including a transistor 11 and a capacitor 12 as illustrated in FIG. 2.

A gate of the transistor 11 is electrically connected to a selection terminal SEL.

The selection terminal SEL receives a selection signal (selection voltage) SEL.

One of a source and a drain of the transistor 11 is electrically connected to the input terminal IN.

The other of the source and the drain of the transistor 11 is electrically connected to the output terminal OUT and the capacitor 12.

One electrode of the capacitor 12 is electrically connected to the other of the source and the drain of the transistor 11.

The other electrode of the capacitor 12 is electrically connected to a power supply that supplies the low supply voltage Vss.

The other electrode of the capacitor 12 may be electrically connected to a power supply that supplies the supply voltage Vdd.

Note that the configuration of the memory 10 is not limited to that in FIG. 2.

In other words, the memory 10 in FIG. 2 may be considered as a charge storage memory using a switch (transistor) and a capacitor in which charge is stored.

The memory 10 in FIG. 2 may be, for example, a charge storage memory using a different switch such as an analog switch or a MEMS switch instead of a transistor.

Note that a plurality of switches and capacitors may be provided in the charge storage memory if necessary.

The memory 10 may be, for example, a memory including an inverter 13 and an inverter 14 as illustrated in FIG. 3.

An input terminal of the inverter 13 is electrically connected to the input terminal IN and an output terminal of the inverter 14.

An output terminal of the inverter 13 is electrically connected to the output terminal OUT and an input terminal of the inverter 14.

Note that the configuration of the memory 10 is not limited to that in FIG. 3.

In other words, the memory 10 in FIG. 3 may be considered as a feedback loop memory that retains data in a feedback loop composed of two inverters.

The memory 10 in FIG. 3 may be, for example, a feedback loop memory using a buffer, a NAND circuit, a NOR circuit, or the like instead of an inverter.

The memory 10 may be a feedback loop memory including two different elements selected from an inverter, a buffer, a NAND circuit, a NOR circuit, and the like.

The memory 10 may be a feedback loop memory using three or more elements.

The memory 20 may be, for example, a memory including a transistor 21 and a capacitor 22 as illustrated in FIG. 2 and FIG. 3.

A gate of the transistor 21 is electrically connected to the input terminal $IN_A$.

One of a source and a drain of the transistor 21 is electrically connected to the output terminal OUT.

The other of the source and the drain of transistor 21 is electrically connected to the capacitor 22.

One electrode of the capacitor 22 is electrically connected to the other of the source and the drain of the transistor 21.

The other electrode of the capacitor 22 is electrically connected to the power supply that supplies the low supply voltage Vss.

The other electrode of the capacitor 22 may be electrically connected to a power supply that supplies the supply voltage Vdd.

When an oxide semiconductor transistor is used as the transistor 21, the memory 20 has a longer retention time than the memory 10, which is a volatile memory.

In other words, an oxide semiconductor transistor has a very low leakage current (off-state current) because an oxide semiconductor has a wide bandgap, so that the charge in the capacitor 22 is not likely to be lost even in case of power down.

Therefore, backing up the data in the memory 10, which is a volatile memory, by using an oxide semiconductor transistor as the transistor 21 extends memory retention time without changing data-processing speed.

Because the transistor 21 is formed using an oxide semiconductor (OS), the symbol "OS" is placed beside the circuit symbol of this transistor.

Although this embodiment describes the case where the transistor 11 and the transistor 21 are n-channel transistors, they may be p-channel transistors if necessary.

The operation of the semiconductor devices in FIG. 2 and FIG. 3 will be described.

In the case of data processing operation, data to be stored is input to the memory 10 from the input terminal IN.

After the data to be stored is input to the memory 10, the data is stored in the memory 10 and then output to the output terminal OUT from the memory 10.

At this time, a signal (voltage) for turning on the transistor 21 is input to the transistor 21 from the input terminal $IN_A$ so that the transistor 21 remains on during data processing operation.

Since the transistor 21 is on, the data (charge) stored in the memory 10 is backed up in the capacitor 22 in the memory 20.

Next, interruption operation during power down (or supply voltage drop) is described.

The magnitude of the supply voltage is monitored by a power supply monitoring device.

When the supply voltage starts to decrease, the power supply monitoring device outputs a signal for turning off the transistor 21.

Then, the transistor 21 is turned off, so that the data (charge) that has been present when the supply voltage has started to decrease is stored in the capacitor 22.

During restart operation which is carried out when the supply of the supply voltage is restarted, the transistor 21 is turned on again, so that processing can be restarted with the data that has been present when the supply voltage has started to decrease.

When the supply voltage starts to decrease, the output of the memory 10, which is a volatile memory, becomes unstable and an undefined potential (undefined voltage) appears at the output port of the memory 10.

If the polarity of the undefined potential (undefined voltage) is different from that of the potential of the data backed up in the capacitor 22, data collision may occur and the data backed up in the capacitor 22 may be lost during restart operation.

In order to prevent data collision during restart operation, the capacitance $C_{20}$ of the memory 20 is preferably set sufficiently higher than the sum of the capacitance $C_{OUT}$ of the output terminal OUT and the capacitance $C_{10}$ of the memory 10. This is represented by the formula $C_{20} \gg C_{OUT}+C_{10}$.

Here, $C_{20}$ is the capacitance of the capacitor 22.

$C_{OUT}$ is parasitic capacitance due to, for example, wiring connecting the output terminal OUT to the memory 10 and the memory 20.

$C_{10}$ is, for example, the capacitance of the capacitor 12 in the case in FIG. 2, and the gate capacitance (channel capacitance) of transistors used in the inverter 14 in the case in FIG. 3.

$C_{20}$ is preferably 1.5 or more times $C_{OUT}+C_{10}$. It is preferable that $C_{20}$ be set as high as possible to ensure the prevention of data collision; therefore, $C_{20}$ is preferably two or more, more preferably five or more, still more preferably ten or more times $C_{OUT}+C_{10}$. However, increasing $C_{20}$ too much results in larger area of the memory 20; therefore, $C_{20}$ is preferably 1.5 to two times $C_{OUT}+C_{10}$.

The contents of this embodiment or part thereof can be implemented in combination with any of the other embodiments and examples.

(Embodiment 3)

As described in Embodiment 2, it is preferable to set $C_{20}$ sufficiently higher than $C_{OUT}+C_{10}$ in order to prevent data collision during restart operation.

In order to increase $C_{20}$, however, the area of the capacitor 22 needs to be increased by several times or more, resulting in an increase in the area of the memory 20 in the semiconductor device.

Structures for solving the foregoing problem are described with reference to FIG. 4, FIG. 5, and FIG. 6.

Figure 4:
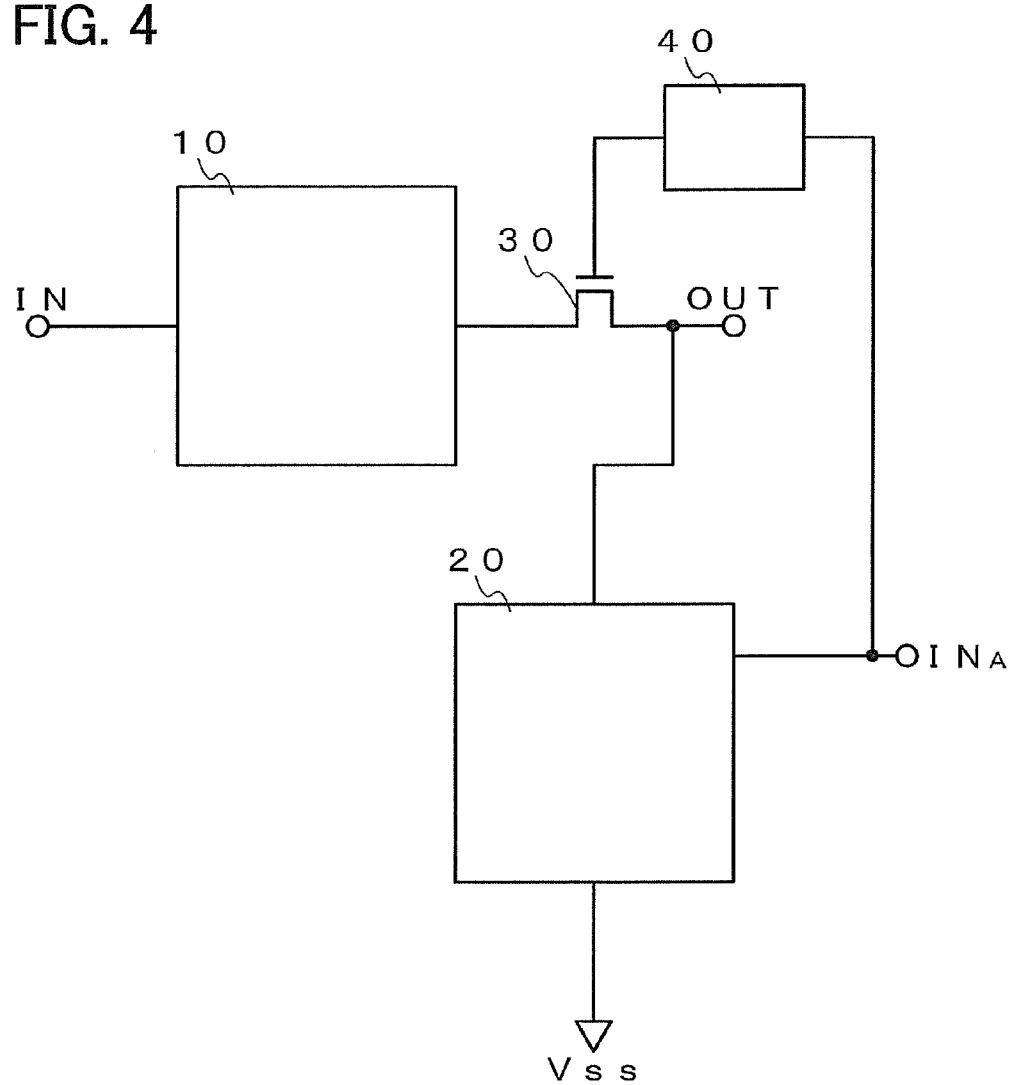
FIG. 4 illustrates an example of a semiconductor device.
Figure 5:
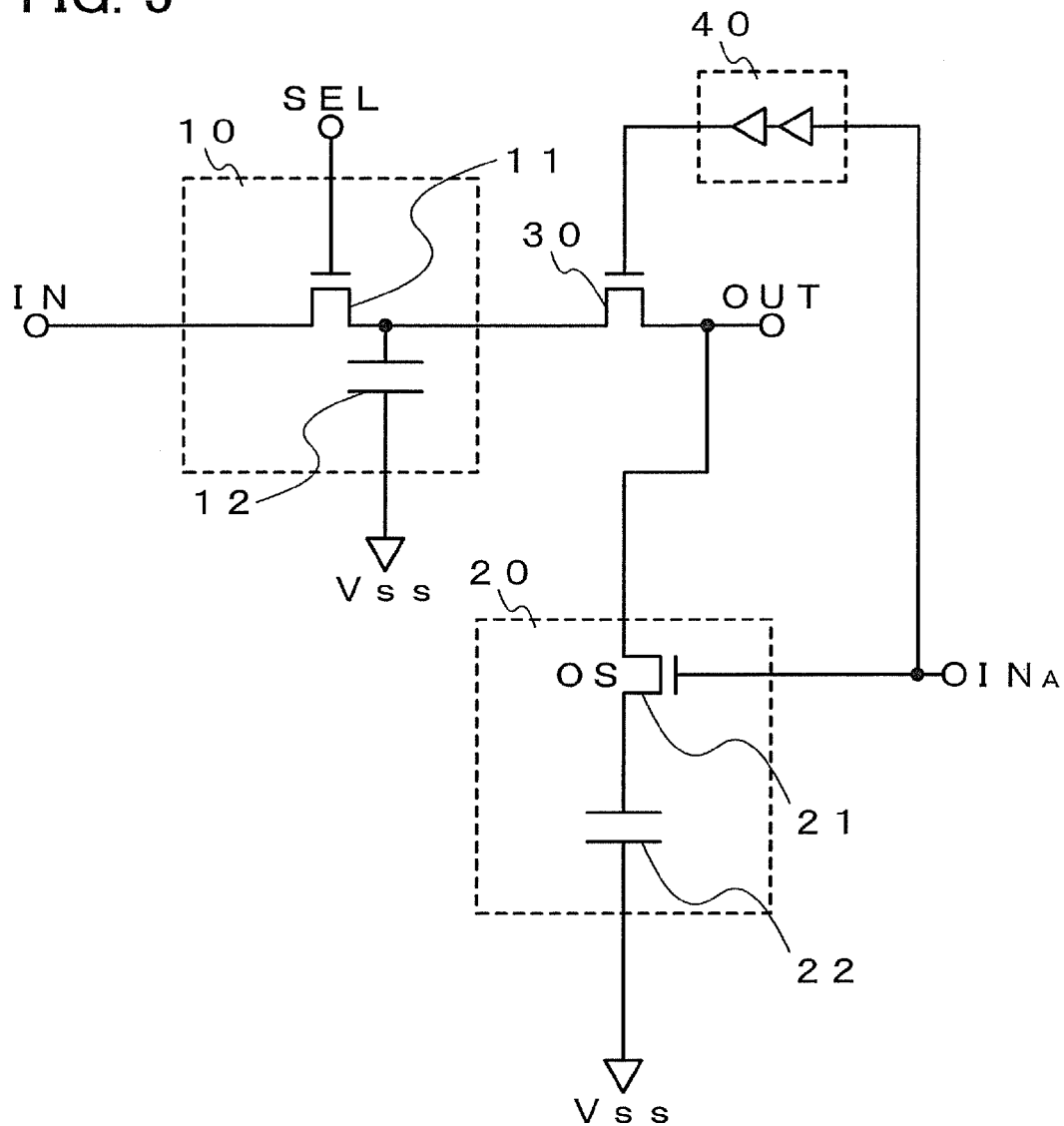
FIG. 5 illustrates an example of a semiconductor device.

The structures in FIG. 4, FIG. 5, and FIG. 6 make $C_{10}$ negligible, inhibiting an increase in the area of the capacitor 22. Note that in this case, the formula $C_{20} \gg C_{OUT}$ is preferably satisfied.

$C_{20}$ is preferably 1.5 or more times $C_{OUT}$. It is preferable that $C_{20}$ be set as high as possible to ensure the prevention of data collision; therefore, $C_{20}$ is preferably two or more, more preferably five or more, still more preferably ten or more times $C_{OUT}$. However, increasing $C_{20}$ too much results in larger area of the memory; therefore, $C_{20}$ is preferably 1.5 to two times $C_{OUT}$.

FIG. 4, FIG. 5, and FIG. 6 illustrate circuits that are the same respectively as those in FIG. 1, FIG. 2, and FIG. 3 except that they also include a switch 30 and a delay circuit 40.

The switch 30 is a data collision prevention switch with a function of preventing data collision during restart operation.

The switch 30 is a transistor in FIG. 4, FIG. 5, and FIG. 6, but is not limited to a transistor.

In FIG. 4, FIG. 5, and FIG. 6, a gate of the transistor used as the switch 30 is electrically connected to an output terminal of the delay circuit 40.

In FIG. 4, FIG. 5, and FIG. 6, one of a source and a drain of the transistor used as the switch 30 (one terminal of the switch) is electrically connected to the output port of the memory 10.

In FIG. 4, FIG. 5, and FIG. 6, the other of the source and the drain of the transistor used as the switch 30 (the other terminal of the switch) is electrically connected to an input/output port of the memory 20.

The operation of the circuits in FIG. 4, FIG. 5, and FIG. 6 will be described.

The data processing operation of the circuits in FIG. 4, FIG. 5, and FIG. 6 is the same as that of the circuits in FIG. 1, FIG. 2, and FIG. 3 except that the switch 30 is kept on.

The interruption operation of the circuits in FIG. 4, FIG. 5, and FIG. 6 is the same as that of the circuits in FIG. 1, FIG. 2, and FIG. 3 except that the switch 30 is kept off.

During restart operation, the transistor 21 is turned on with the switch 30 kept off so that the data backed up in the memory 20 is output to the output terminal OUT.

After the operation of the entire device (especially the potential (voltage) of the output port of the memory 10) is stabilized, the switch 30 is turned on to continue data processing.

In other words, the transistor 21 and then the switch 30 are turned on in sequence with time difference.

In particular, it is preferable that a signal (voltage) from the input terminal $IN_A$ be input to the transistor 21, and a signal (voltage) from the input terminal $IN_A$ be input to the switch 30 via the delay circuit 40 because it enables the sequence of turning on the transistor 21 and the switch 30 to be determined with a simple configuration.

Since it is only necessary to turn on the transistor 21 and then the switch 30 in sequence with time difference, the operation in which the transistor 21 and then the switch 30 are turned on in sequence with time difference may be achieved by any other circuit configuration without providing the delay circuit 40.

The time interval from when the transistor 21 is turned on and to when the switch 30 is turned on may be adjusted as appropriate by design considering the time required for the operation of the entire device to stabilize.

The switch 30 in this embodiment is an n-channel transistor, but may instead be a p-channel transistor.

The switch 30 may be an analog switch, a MEMS switch, or the like.

In the case where a transistor is used as the switch 30, it is preferable that the conductivity type of the transistor used as the switch 30 be the same as that of the transistor 21.

In the case where a transistor is used as the switch 30 and the conductivity type of the transistor used as the switch 30 is different from that of the transistor 21, the delay circuit 40 is preferably provided with an element which inverts the polarity of a signal (voltage), such as an inverter.

The switch 30 is used to prevent data collision; therefore, use of an oxide semiconductor transistor with a very low leakage current as the switch 30 is preferable because it ensures the prevention of data collision.

Further, use of an oxide semiconductor transistor as the switch 30 is preferable because it enables a semiconductor layer in the switch 30 and a semiconductor layer in the transistor 21 to be formed of a common layer (formed integrally), thereby reducing the circuit area.

The delay circuit 40 may be composed of, but not limited to, a plurality of buffer circuits connected in series as illustrated in FIG. 5 and FIG. 6.

Note that the configuration of the delay circuits in FIG. 5 and FIG. 6 is preferable because it is very simple and thus reduces the number of elements. A configuration in which two buffer circuits are connected in series as illustrated in FIG. 5 and FIG. 6 is preferred to reduce the number of elements. If an increase in the number of elements is acceptable, three or more buffer circuits may be connected in series.

The contents of this embodiment or part thereof can be implemented in combination with any of the other embodiments and examples.

(Embodiment 4)

Figure 7A:
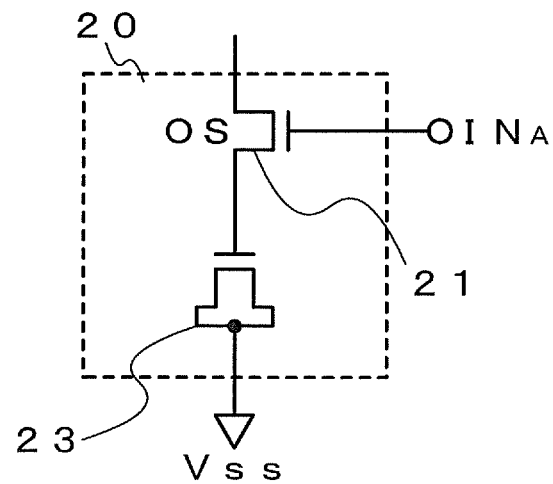
FIGS. 7A and 7B each illustrate an example of a semiconductor device.

As illustrated in FIG. 7A, the capacitor 22 may be replaced by a MOS capacitor 23.

In the case where the MOS capacitor 23 is used, a semiconductor for the MOS capacitor 23 preferably includes silicon.

The transistor 21 is disposed over the MOS capacitor 23, and a semiconductor layer in the transistor 21 and a gate electrode of the MOS capacitor 23 are formed so as to overlap with each other. Thus, the semiconductor layer of the transistor 21 and the gate electrode of the MOS capacitor 23 can be electrically connected to each other without wiring, so that the circuit area can be reduced.

Figure 7B:
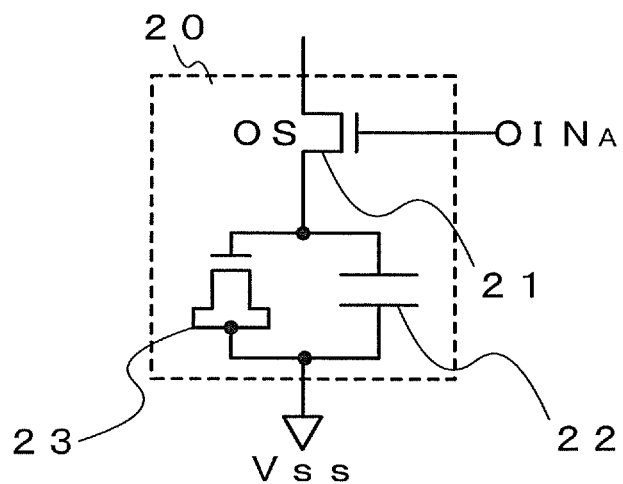

Moreover, it is preferable to add the capacitor 22 to the configuration in FIG. 7A to increase the capacitance. In other words, the configuration in FIG. 7B is preferable.

In particular, it is preferable that the capacitor 22, the semiconductor layer in the transistor 21, and the gate electrode of the MOS capacitor 23 be disposed to overlap with one another because it increases the capacitance without dramatically increasing the circuit area.

The contents of this embodiment or part thereof can be implemented in combination with any of the other embodiments and examples.

(Embodiment 5)

This embodiment describes a semiconductor material.

The semiconductor including silicon may be silicon (Si), silicon germanium (SiGe), or the like.

Note that the semiconductor including silicon preferably has crystallinity to conduct high-speed data processing.

The semiconductor with crystallinity may be, for example, a microcrystalline semiconductor, a polycrystalline semiconductor, or a single crystal semiconductor, but a single crystal semiconductor is most preferably used to conduct high-speed data processing.

The semiconductor with crystallinity may be any semiconductor that has crystallinity, such as a single crystal semiconductor, a polycrystalline semiconductor, or a microcrystalline semiconductor, but a single crystal semiconductor, which has a high mobility, is most preferably used to achieve high-speed operation of the transistor.

The oxide semiconductor preferably includes at least indium (In) or zinc (Zn). In particular, In and Zn are preferably contained.

As a stabilizer for reducing variation in electric characteristics of a transistor including the oxide semiconductor, it is preferable that one or more selected from gallium (Ga), tin (Sn), hafnium (Hf), aluminum (Al), or a lanthanoid are contained.

Examples of lanthanoids include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As a single-component metal oxide included in the oxide semiconductor, for example, an indium oxide, a tin oxide, a zinc oxide, or the like can be used.

As a two-component metal oxide included in the oxide semiconductor, for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

As a three-component metal oxide included in the oxide semiconductor, for example, an In—Ga—Zn-based oxide, an In—Sn—Zn-based oxide (also referred to as ITZO), a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

As a four-component metal oxide included in the oxide semiconductor, for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

For example, an In—Ga—Zn-based oxide with an In:Ga:Zn atomic ratio of 1:1:1 (=1/3:1/3:1/3) or 2:2:1 (=2/5:2/5:1/5), or any oxide whose composition is in the neighborhood of the above compositions can be used.

Alternatively, an In—Sn—Zn-based oxide with an In:Sn:Zn atomic ratio of 1:1:1 (=1/3:1/3:1/3), 2:1:3 (=1/3:1/6:1/2), or 2:1:5 (=1/4:1/8:5/8), or any oxide whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that the amorphous structure has many defects; therefore, a non-amorphous structure is preferred.

The contents of this embodiment or part thereof can be implemented in combination with any of the other embodiments and examples.

(Embodiment 6)

In FIG. 1, FIG. 2, FIG. 3, FIG. 4, FIG. 5, and FIG. 6, a rewritable nonvolatile memory may be used as the memory 20.

The nonvolatile memory retains charge even without being supplied with power supply, thereby achieving back up of the data in a volatile memory.

The nonvolatile memory may be, but not limited to, an EEPROM, a NOR flash memory, a NAND flash memory, a FeRAM, or the like.

The contents of this embodiment or part thereof can be implemented in combination with any of the other embodiments and examples.

(Embodiment 7)

Conventionally, in a CPU, the data of each stage in pipeline processing is stored in a volatile memory, such as a register, provided between stages. Hence, in case of power down during pipeline processing, the data in the volatile memory is lost and the pipeline processing needs to be started all over again.

The use of the invention described in Embodiments 1 to 6 allows the data of each stage in the pipeline processing to be all backed up, so that the pipeline processing can be started again from the middle.

Figure 8A:
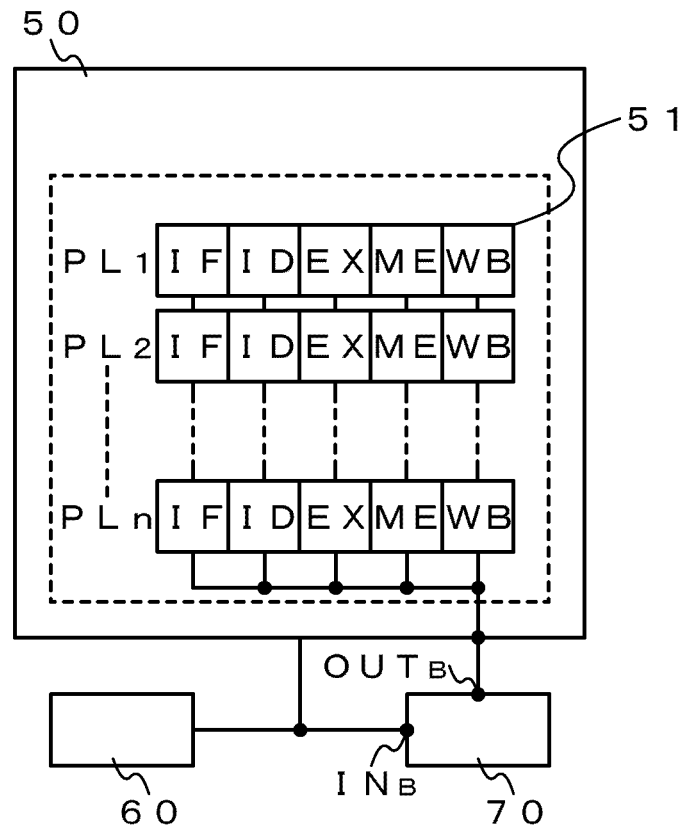
FIGS. 8A and 8B illustrate an example of a semiconductor device.
Figure 8B:
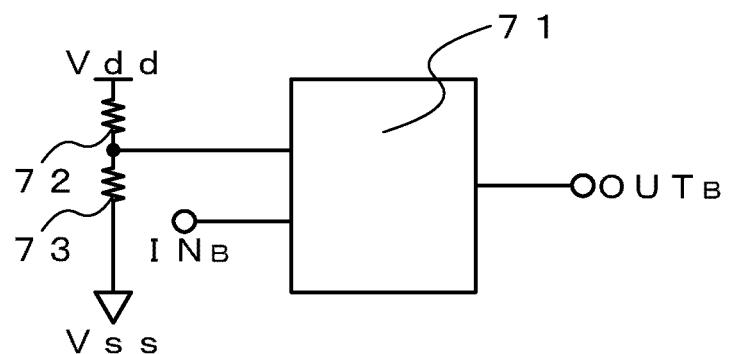

FIGS. 8A and 8B illustrate a semiconductor device including a CPU 50, a power supply circuit 60, and a power supply monitoring device 70.

The CPU 50 includes pipeline circuits 51 ($PL_1$ to $PL_n$).

Each pipeline circuit includes, for example, circuits of a stage IF (fetch), a stage ID (decode), a stage EX (execution), a stage ME (memory access), and a stage WB (write back).

After processing of these stages is finished, data is stored in a memory using the invention described in Embodiments 1 to 6.

Here, the power supply circuit 60 regulates the supply voltage, and supplies voltage to the CPU 50 and the power supply monitoring device 70.

The power supply monitoring device 70 may be, but not limited to, a circuit illustrated in FIG. 8B.

The power supply monitoring device in FIG. 8B includes a comparator circuit 71, a resistor 72, and a resistor 73.

The comparator circuit 71 is a differential amplifier or the like, and outputs a signal for storing charge in the memory 20 in FIG. 1, FIG. 2, FIG. 3, FIG. 4, FIG. 5, and FIG. 6 (a signal for turning off the transistor 21).

One input terminal of the comparator circuit 71 is electrically connected to one terminal of the resistor 72 and one terminal of the resistor 73.

The other input terminal of the comparator circuit 71 is electrically connected to an input terminal $IN_B$.

An output terminal of the comparator circuit 71 is electrically connected to an output terminal $OUT_B$.

The other terminal of the resistor 72 is electrically connected to a power supply that supplies a supply voltage Vdd.

The other terminal of the resistor 73 is electrically connected to a power supply that supplies a low supply voltage Vss.

By adjusting the ratio of the resistance of the resistor 72 to the resistance of the resistor 73, a signal for storing charge in the memory 20 in FIG. 1, FIG. 2, FIG. 3, FIG. 4, FIG. 5, and FIG. 6 (a signal for turning off the transistor 21) can be output in accordance with the amount of decrease in the supply voltage.

For example, the ratio of the resistance of the resistor 72 to the resistance of the resistor 73 may be set to 3:7 in order to output a signal for storing charge in the memory 20 in FIG. 1, FIG. 2, FIG. 3, FIG. 4, FIG. 5, and FIG. 6 (a signal for turning off the transistor 21) when the supply voltage Vdd decreases by 30% or more.

As described above, the use of a memory cell according to Embodiments 1 to 6 as a memory cell provided between stages in the pipeline processing allows the data of each stage in the pipeline processing to be all backed up, so that the pipeline processing can be started again from the middle.

Specifically, the outputs of a plurality of pipeline circuits may each be connected to a memory cell.

The contents of this embodiment or part thereof can be implemented in combination with any of the other embodiments and examples.

(Embodiment 8)

Figure 9A:
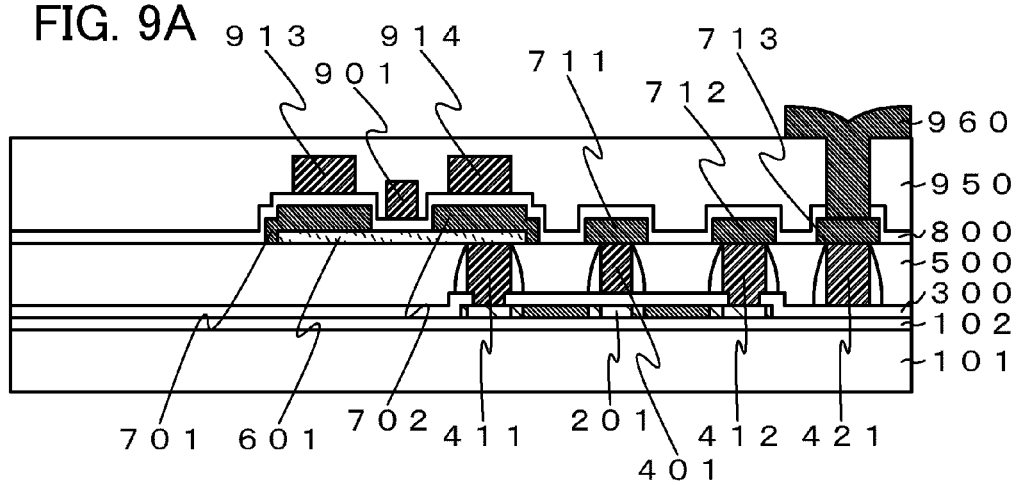
FIGS. 9A to 9C each illustrate an example of a semiconductor device.

FIG. 9A illustrates an example of a semiconductor device including the memory cell in FIG. 2.

Figure 9B:
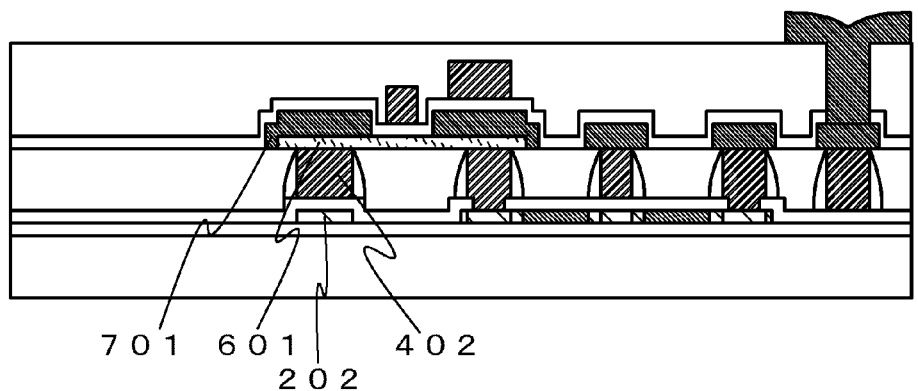

FIG. 9B illustrates an example of a semiconductor device which is the same as that in FIG. 2 except that it includes the memory 20 in FIG. 7A instead of the memory 20 in FIG. 2.

Figure 9C:
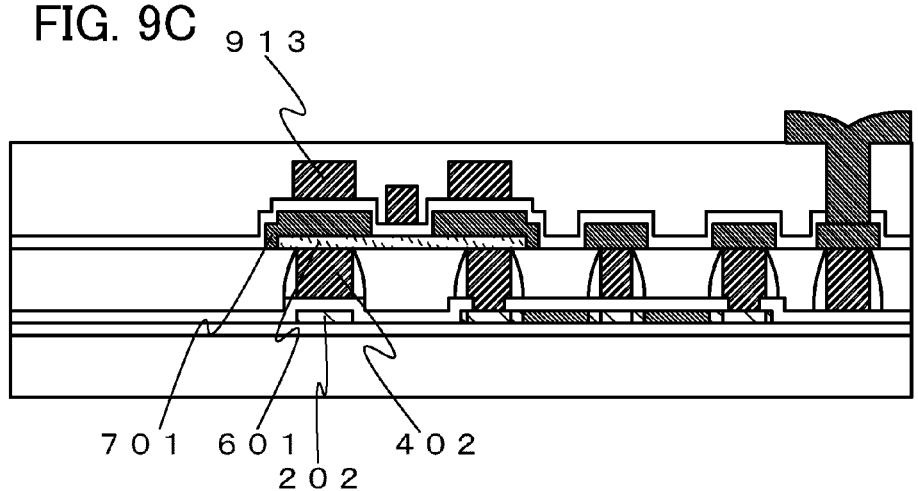

FIG. 9C illustrates an example of a semiconductor device which is the same as that in FIG. 2 except that it includes the memory 20 in FIG. 7B instead of the memory 20 in FIG. 2.

Figure 10A:
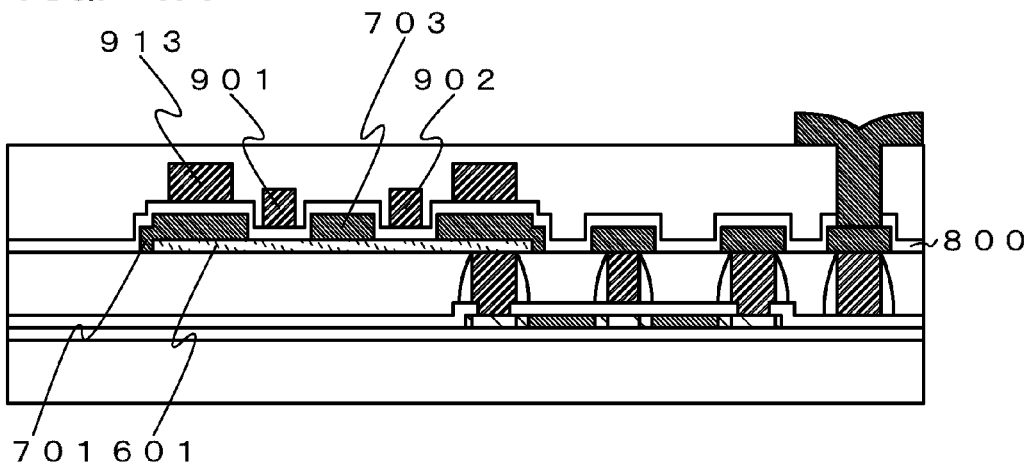
FIGS. 10A to 10C each illustrate an example of a semiconductor device.

FIG. 10A illustrates an example of a semiconductor device including the memory cell in FIG. 5.

Figure 10B:
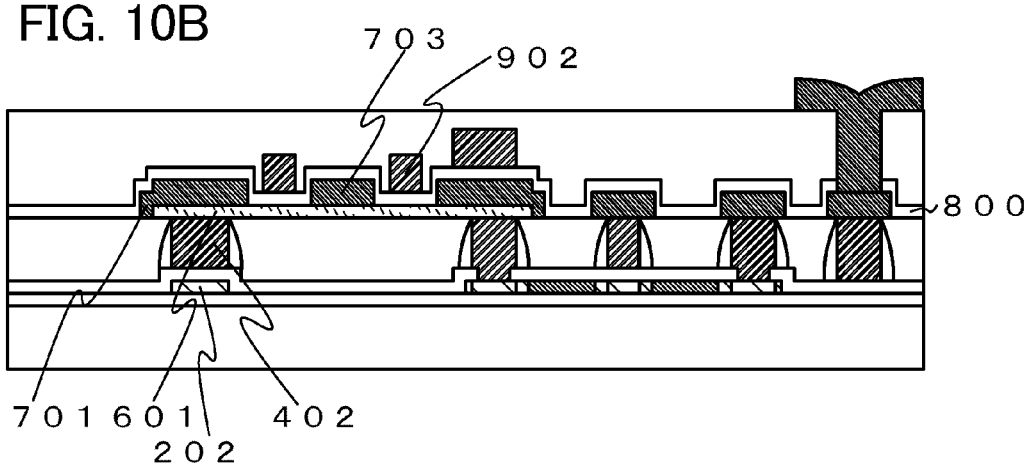

FIG. 10B illustrates an example of a semiconductor device which is the same as that in FIG. 5 except that it includes the memory 20 in FIG. 7A instead of the memory 20 in FIG. 5.

Figure 10C:
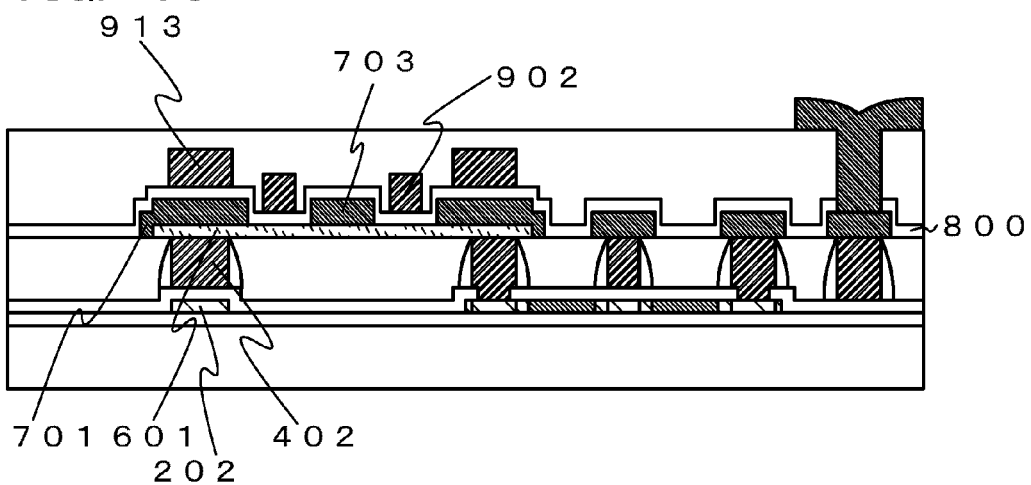

FIG. 10C illustrates an example of a semiconductor device which is the same as that in FIG. 5 except that it includes the memory 20 in FIG. 7B instead of the memory 20 in FIG. 5.

In FIGS. 9A to 9C and FIGS. 10A to 10C, the same portions or portions having similar functions are denoted by the same reference numerals in different drawings, and explanation thereof will not be repeated.

<FIG. 9A and FIG. 2>

In FIG. 9A, over a substrate 101, an insulating layer 102, a semiconductor layer 201 over the insulating layer 102, an insulating layer 300 over the semiconductor layer 201, and a gate electrode 401 over the insulating layer 300 are provided.

The insulating layer 300 is a gate insulating layer.

The semiconductor layer 201, the insulating layer 300, and the gate electrode 401 correspond respectively to a semiconductor layer, a gate insulating layer, and a gate electrode in the transistor 11 in FIG. 2.

Openings reaching the semiconductor layer 201 are formed in the insulating layer 300.

A connection electrode 411, a connection electrode 412, and a connection electrode 421 are formed in the same steps (of the same material, and from the same starting film) as the gate electrode 401.

The connection electrode 411 and the connection electrode 412 are provided over exposed portions of the semiconductor layer 201 in the openings.

The connection electrode 421 is provided over the insulating layer 300.

Sidewalls are formed on side surfaces of the gate electrode and connection electrodes to form LDD regions in the semiconductor layer; the sidewalls are not necessarily formed.

An insulating layer 500 is embedded between the gate electrode and each connection electrode.

The insulating layer 500 can be formed in an embedded structure by forming an insulating layer on the entire region and then subjecting the insulating layer to etch-back or polishing (e.g., mechanical polishing or chemical mechanical polishing (CMP)).

The embedded structure of the insulating layer 500 allows top surfaces (surfaces) of the gate electrode and connection electrodes to be exposed without forming a contact hole, thereby reducing the number of masks.

Although the above process is an example of the gate-first process, the gate-last process may instead be employed.

In the case of the gate-last process, the gate electrode and the connection electrodes are embedded in openings in the insulating layer 500.

A semiconductor layer 601 is provided over the insulating layer 500 and the connection electrode 411.

The semiconductor layer 601 corresponds to the semiconductor layer in the transistor 21 in FIG. 2.

By forming the connection electrode 411 in the same steps as the gate electrode 401 and disposing the connection electrode 411 at a position overlapping with the two semiconductor layers, the transistors can be electrically connected to each other without the formation of additional wiring.

An electrode 701 and an electrode 702 are provided over the semiconductor layer 601.

Wiring 711 is provided over the insulating layer 500 and the gate electrode 401.

Wiring 712 is provided over the insulating layer 500 and the connection electrode 412.

Wiring 713 is provided over the insulating layer 500 and the connection electrode 421.

The electrode 701, the electrode 702, the wiring 711, the wiring 712, and the wiring 713 are preferably formed in the same steps.

Note that in FIGS. 9A to 9C, the electrode 702 is electrically connected to the output terminal OUT.

An insulating layer 800 is formed over the semiconductor layer 601, the electrode 701, the electrode 702, the wiring 711, the wiring 712, and the wiring 713.

The insulating layer 800 is a gate insulating layer.

A gate electrode 901 overlapping with the semiconductor layer 601, an electrode 913 overlapping with the electrode 701, and an electrode 914 overlapping with the electrode 702 are provided over the insulating layer 800.

The semiconductor layer 601, the insulating layer 800, and the gate electrode 901 correspond respectively to the semiconductor layer, a gate insulating layer, and a gate electrode in the transistor 21 in FIG. 2

The electrode 701, the insulating layer 800, and the electrode 913 correspond respectively to one electrode, a dielectric layer, and the other electrode in the capacitor 22 in FIG. 2.

The electrode 702, the insulating layer 800, and the electrode 914 correspond respectively to one electrode, a dielectric layer, and the other electrode in the capacitor 12 in FIG. 2.

The electrode 913 and the electrode 914 are electrically connected to the power supply that supplies the low supply voltage Vss.

Thus, one end of the semiconductor layer in the transistor 21 in FIG. 2 overlaps with the capacitor 12, and the other end of the semiconductor layer in the transistor 21 in FIG. 2 overlaps with the capacitor 22, so that the area of the memory cell can be reduced.

Note that the electrode 701 serves as the electrode of the capacitor 12 and one of a source and drain electrodes of the transistor 21.

Note that the electrode 702 serves as the electrode of the capacitor 22 and the other of the source and drain electrodes of the transistor 21.

An insulating layer 950 is provided over the gate electrode 901, the electrode 913, and the electrode 914.

Wiring 960 electrically connected to the wiring 713 in a contact hole in the insulating layer 950 and the insulating layer 800 is provided over the insulating layer 950.

By routing any of the layers (structures) such as the connection electrode 421, the wiring 713, and the wiring 960, elements (e.g., capacitors and transistors) can be connected as appropriate.

Therefore, it is preferable to form a plurality of structures such as the connection electrode 421, the wiring 713, and the wiring 960.

<FIG. 9B and FIG. 7A>

FIG. 9B illustrates a structure that is the same as that in FIG. 9A except that the electrode 913 is not provided and that a semiconductor layer 202 and a gate electrode 402 are provided.

FIG. 9B illustrates the case where the semiconductor device in FIG. 2 uses the memory in FIG. 7A.

The semiconductor layer 202, the insulating layer 300, and the gate electrode 402 correspond respectively to a semiconductor layer, a gate insulating layer, and a gate electrode in the MOS capacitor 23 in FIG. 7A.

Note that in FIG. 9B, the longitudinal direction in the semiconductor layer 202 intersects the longitudinal direction in the semiconductor layer 601.

The semiconductor layer 202 is electrically connected to the power supply that supplies the low supply voltage Vss.

It is preferable that the gate electrode 402 be formed in the same steps as the gate electrode 401, and the semiconductor layer 202 be formed in the same steps as the semiconductor layer 201.

The gate electrode 402 is disposed at a position overlapping with the semiconductor layer 601.

The structure in FIG. 9B achieves a reduction in the area of the memory cell.

<FIG. 9C and FIG. 7B>

FIG. 9C illustrates a semiconductor device that is the same as that in FIG. 9B except that an electrode 913 is added.

FIG. 9C illustrates the case where the semiconductor device in FIG. 2 uses the memory in FIG. 7B.

In FIG. 9C, the semiconductor layer in the transistor 21 in FIG. 7B, the capacitor 22 in FIG. 7B, and the MOS capacitor 23 in FIG. 7B overlap with one another, so that the capacitance can be increased without dramatically increasing the area of the memory cell.

Note that the electrode 913 and the semiconductor layer 202 are electrically connected to the power supply that supplies the low supply voltage Vss.

<FIGS. 10A to 10C, FIG. 5, and FIGS. 7A and 7B>

FIG. 10A illustrates a semiconductor device that is the same as that in FIG. 9A except that a gate electrode 902 and an electrode 703 are added.

FIG. 10B illustrates a semiconductor device that is the same as that in FIG. 9B except that the gate electrode 902 and the electrode 703 are added.

FIG. 10C illustrates a semiconductor device that is the same as that in FIG. 9C except that the gate electrode 902 and the electrode 703 are added.

FIGS. 10A to 10C are structures including the switch 30 like that in FIG. 5.

In other words, the semiconductor layer 601, the insulating layer 800, and the gate electrode 902 correspond respectively to a semiconductor layer, a gate insulating layer, and a gate electrode in the switch 30 in FIG. 5.

The semiconductor layer 601, the insulating layer 800, and the gate electrode 901 correspond respectively to a semiconductor layer, a gate insulating layer, and a gate electrode in the transistor 21 in FIG. 5.

In other words, in FIGS. 10A to 10C, the semiconductor layer in the transistor 21 in FIG. 5 and the semiconductor layer in the switch 30 in FIG. 5 are formed of a common layer (formed integrally).

Since the semiconductor layer in the transistor 21 in FIG. 5 and the semiconductor layer in the switch 30 in FIG. 5 are formed of a common layer (formed integrally), the area of the memory cell is prevented from increasing in the case where the switch 30 is provided.

The gate electrode 902 is preferably formed in the same steps as the gate electrode 901.

The electrode 703 is preferably formed in the same steps as the electrode 701.

Note that in FIGS. 10A to 10C, the electrode 703 is electrically connected to the output terminal OUT.

<FIGS. 16A to 16C, FIGS. 17A to 17C, and FIGS. 18A to 18C>

The semiconductor layer 601 of an oxide semiconductor may have a high resistance.

If the semiconductor layer 601 of an oxide semiconductor has too high a resistance in the structures in FIGS. 9A to 9C and FIGS. 10A to 10C, conduction between the connection electrode 411 and the electrode 702 (or the electrode 701 and the gate electrode 402) may be broken by the semiconductor layer 601.

When conduction between the connection electrode 411 and the electrode 702 (or the electrode 701 and the gate electrode 402) is broken by the semiconductor layer 601, charge cannot easily be stored in the capacitor.

Figure 16A:
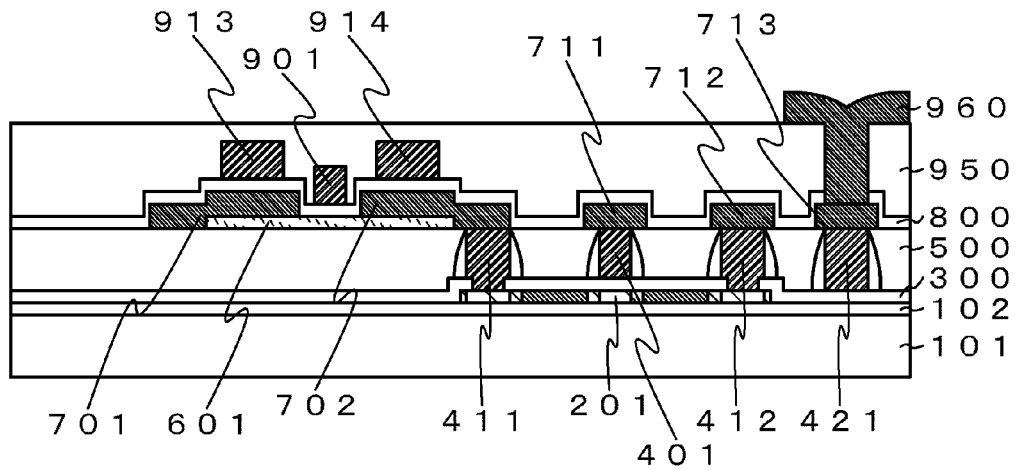
FIGS. 16A to 16C each illustrate an example of a semiconductor device.
Figure 16B:
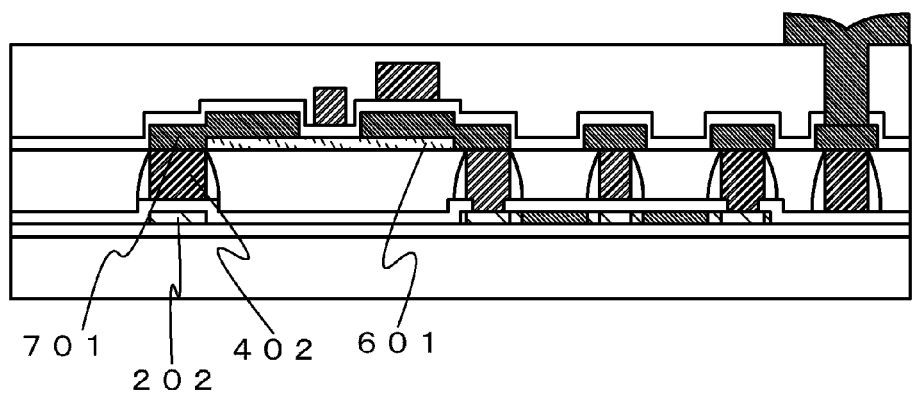
Figure 16C:
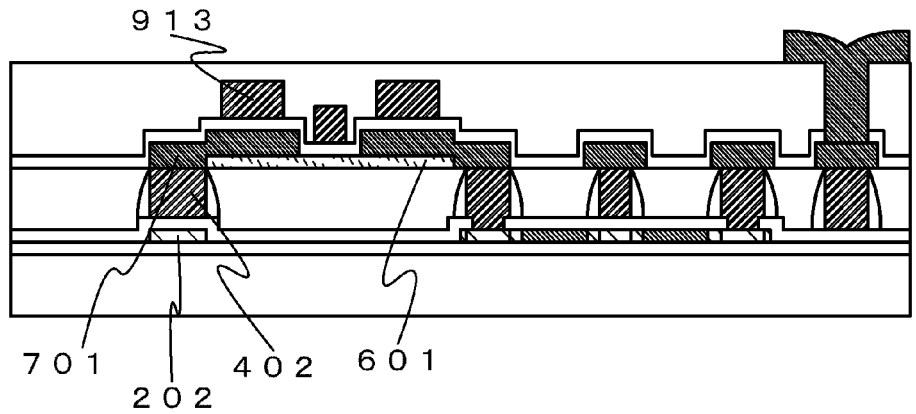

To solve the foregoing problem, as illustrated in FIGS. 16A to 16C, the electrode 702 may be extended beyond an edge of the semiconductor layer 601 and a portion of the electrode 702 beyond the edge is disposed so as to be in contact with the underlying connection electrode 411. This ensures conduction between the connection electrode 411 and the electrode 702 even when the semiconductor layer 601 of an oxide semiconductor has too high a resistance.

Moreover, as illustrated in FIGS. 16B and 16C, the electrode 701 may be extended to beyond an edge of the semiconductor layer 601 and a portion of the electrode 701 beyond the edge is disposed so as to be in contact with the underlying gate electrode 402. This ensures conduction between the gate electrode 402 and the electrode 701 even when the semiconductor layer 601 of an oxide semiconductor has too high a resistance.

However, if the semiconductor layer 601 and the underlying electrode (e.g., the connection electrode 411 or the gate electrode 402) are formed so that they may not overlap with each other as illustrated in FIGS. 16A to 16C, the area of the memory cell is slightly increased.

Figure 17A:
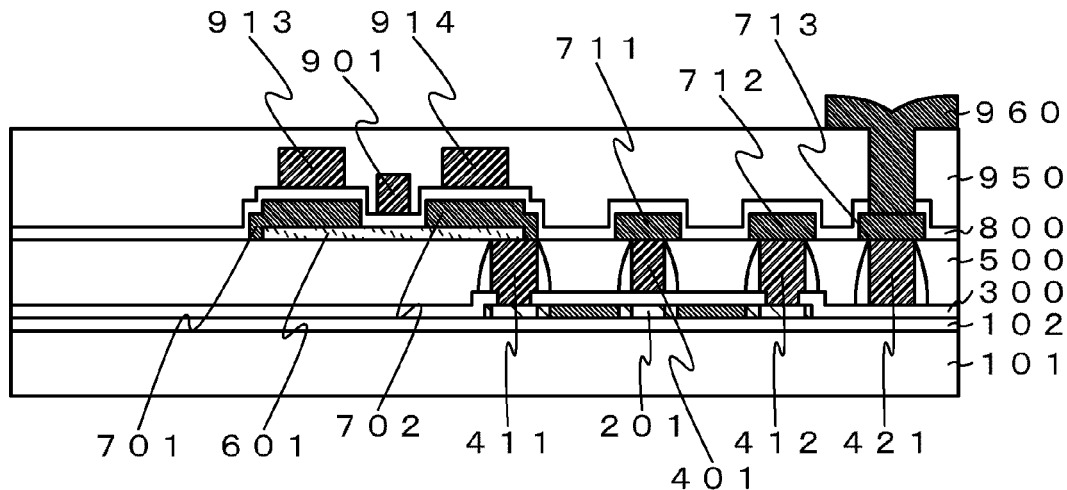
FIGS. 17A to 17C each illustrate an example of a semiconductor device.
Figure 17B:
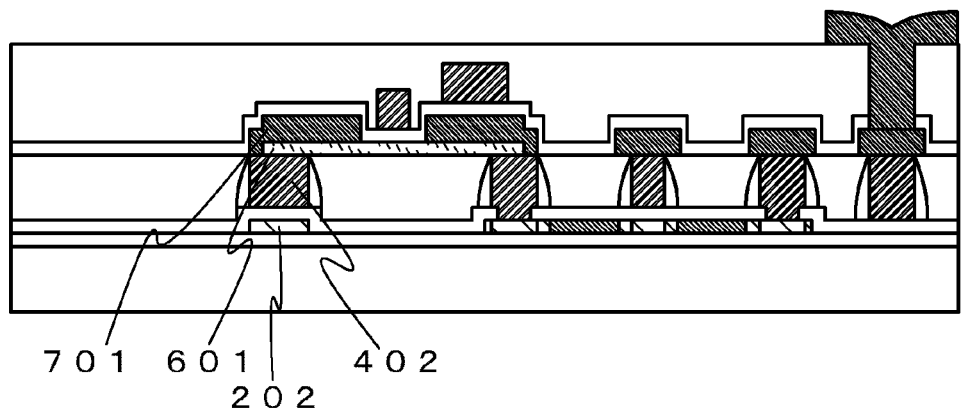
Figure 17C:
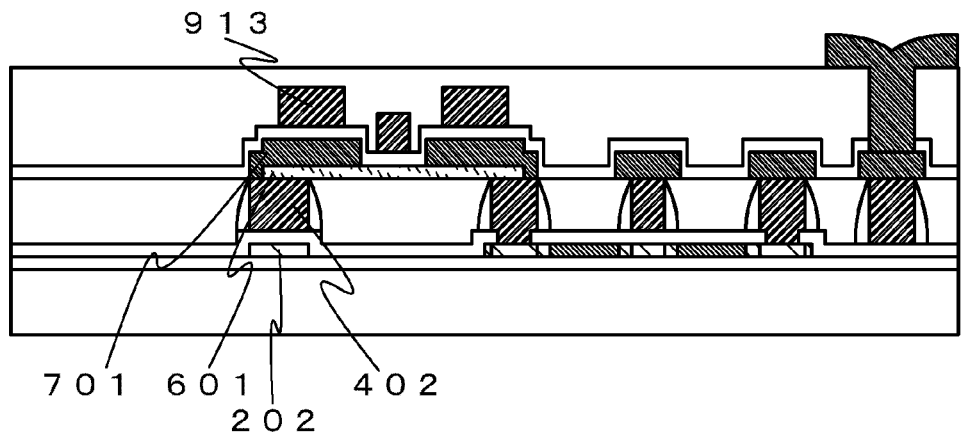

To solve the foregoing problem, both the semiconductor layer 601 and the electrode 702 may be disposed so as to overlap with the connection electrode 411 as illustrated in FIGS. 17A to 17C, which reduces the area of the memory cell to smaller than that in the cases shown in FIGS. 16A to 16C.

Moreover, as illustrated in FIGS. 17B and 17C, both the semiconductor layer 601 and the electrode 701 may be disposed so as to overlap with the gate electrode 402, which reduces the area of the memory cell to smaller than that in the cases shown in FIGS. 16B and 16C.

Figure 18A:
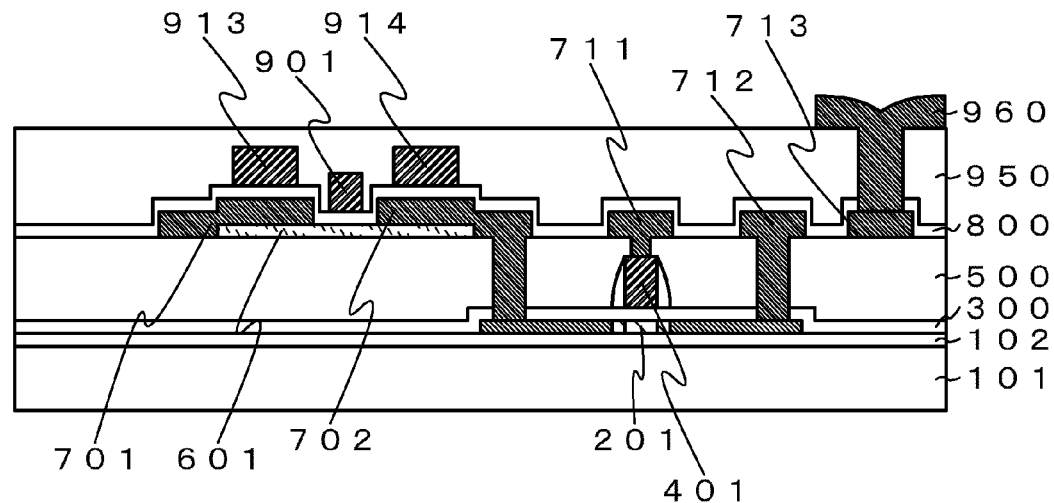
FIGS. 18A to 18C each illustrate an example of a semiconductor device.
Figure 18B:
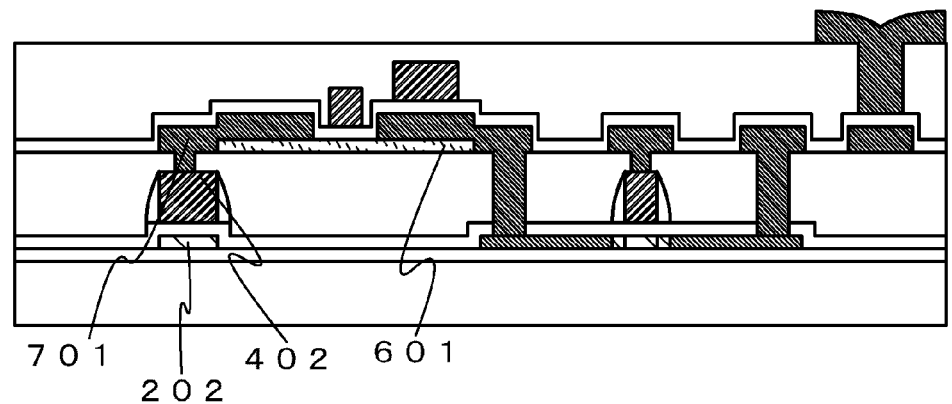
Figure 18C:
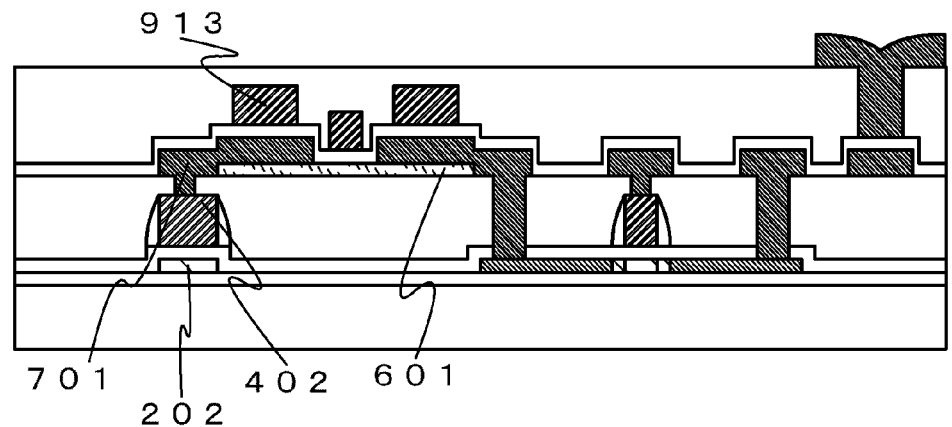

In the cases shown in FIGS. 9A to 9C, instead of forming the connection electrodes, contact holes may be formed in the insulating layer 500 and the insulating layer 300 as illustrated in FIGS. 18A to 18C to provide an electrical connection between the overlying and underlying electrodes.

Note that FIGS. 16A to 16C relate respectively to FIGS. 9A to 9C, and also relate to FIG. 1, FIG. 2, and FIG. 3.

Note that FIGS. 17A to 17C relate respectively to FIGS. 9A to 9C, and also relate to FIG. 1, FIG. 2, and FIG. 3.

Note that FIGS. 18A to 18C relate respectively to FIGS. 9A to 9C, and also relate to FIG. 1, FIG. 2, and FIG. 3.

The structures in FIGS. 16A to 16C, FIGS. 17A to 17C, and FIGS. 18A to 18C can be related to FIGS. 10A to 10C, FIG. 4, FIG. 5, and FIG. 6 if provided additionally with the electrode 703 and the gate electrode 902 as in FIGS. 10A to 10C.

In other words, the structures in FIGS. 16A to 16C, FIGS. 17A to 17C, and FIGS. 18A to 18C can be used in appropriate combination with those in FIGS. 10A to 10C.

<Material for Layers>

The substrate 101, the insulating layer 102, and the semiconductor layer 201 may be a semiconductor on insulator (SOI) substrate. Specifically, a semiconductor layer in an SOI substrate is processed into an island shape by etching, so that the substrate 101, the insulating layer 102, and the semiconductor layer 201 are formed.

Alternatively, the structures in FIGS. 9A to 9C and FIGS. 10A to 10C may be formed by forming the insulating layer 102 and then the semiconductor layer 201 over the substrate 101.

The substrate 101 may be, but not limited to, a silicon wafer, a glass substrate, a quartz substrate, or a metal substrate (e.g., a stainless steel substrate).

Note that instead of the structures in FIGS. 9A to 9C and FIGS. 10A to 10C, a structure where a transistor is formed using a silicon wafer may be employed.

The semiconductor layer 201 and the semiconductor layer 202 are preferably formed of a semiconductor including silicon.

The semiconductor layer 601 is preferably formed of an oxide semiconductor.

The insulating layers may be formed of any insulating material. The insulating layers may be, but not limited to, a silicon oxide film, a silicon nitride film, a silicon oxide film containing nitrogen, a silicon nitride film containing oxygen, a polyimide film, an acrylic film, a siloxane polymer film, an aluminum nitride film, an aluminum oxide film, or a hafnium oxide film. The insulating layers may have either a signal layer structure or a layered structure.

The electrodes (including the gate electrodes, the connection electrodes, and the like) and the wirings may be formed of any conductive material. The materials for these electrodes and wirings may be, but not limited to, aluminum, titanium, molybdenum, tungsten, gold, silver, copper, silicon doped with an impurity imparting conductivity, various alloys, an oxide conductive material (typically indium tin oxide or the like). The electrodes (including the gate electrodes, the connection electrodes, and the like) and the wirings may have either a signal layer structure or a layered structure.

The contents of this embodiment or part thereof can be implemented in combination with any of the other embodiments and examples.

(Embodiment 9)

Although Embodiment 8 has described cases of a top-gate transistor, a bottom-gate transistor or a transistor with a Fin-FET structure may instead be used.

Alternatively, a top-gate transistor different from those described in Embodiment 8 may be used.

In other words, any transistor structure can be used.

The contents of this embodiment or part thereof can be implemented in combination with any of the other embodiments and examples.

(Embodiment 10)

An inverter using a p-channel transistor and an n-channel transistor can be used as the inverters used in the memory 10 in FIG. 3 and FIG. 6.

For high-speed data processing, it is preferable that the p-channel transistor and the n-channel transistor be formed using a semiconductor including silicon.

The contents of this embodiment or part thereof can be implemented in combination with any of the other embodiments and examples.

(Embodiment 11)

The transistor 21 used in the memory 20 in FIG. 2, FIG. 3, FIG. 5, and FIG. 6 is preferably a normally-off transistor.

During data processing, a signal for turning on the transistor 21 is supplied to the input terminal $IN_A$.

During power down (or supply voltage drop), a signal for turning off the transistor 21 is supplied to the input terminal $IN_A$ in response to a signal from the voltage monitor.

On the other hand, in the case where the transistor 21 is a normally-on transistor, an internal power supply 80 supplying a voltage by which the transistor 21 is turned off allows the transistor 21 to remain off even in case of interruption of the supply of power from an external circuit.

Figure 11A:
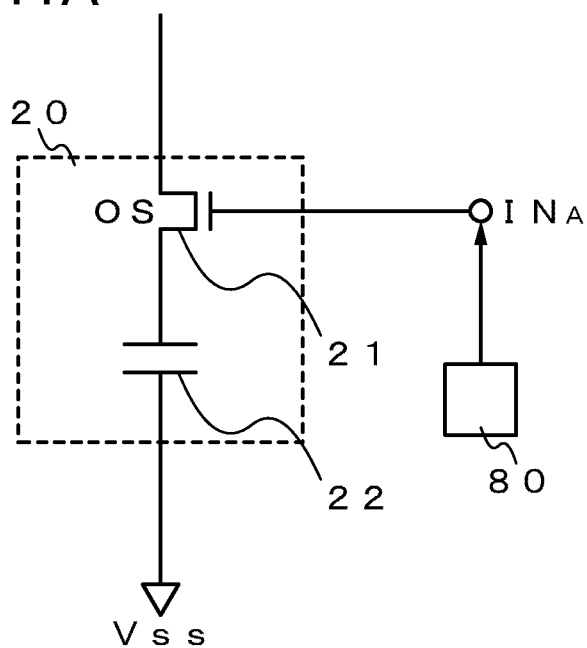
FIGS. 11A and 11B each illustrate an example of a semiconductor device.

Specifically, during power down (or supply voltage drop), the internal power supply 80 supplies a voltage by which the transistor 21 is turned off to the input terminal $IN_A$ in FIG. 11A in response to a signal from the power supply monitoring device. FIG. 11A illustrates the memory 20 in the semiconductor devices illustrated in FIG. 2, FIG. 3, FIG. 5, and FIG. 6.

When composed of, for example, a voltage generator and a power supply circuit, the internal power supply 80 can supply a voltage for keeping the transistor 21 off. Needless to say, the internal power supply 80 is not limited to this, and may be anything that has a function of supplying a voltage for keeping the transistor 21 off.

Performance of data processing or retention of the data in all the volatile memories requires a voltage generator for supplying a large amount of voltage, such as an external circuit that supplies voltage.

On the other hand, the internal power supply 80 only needs to supply a voltage for keeping the transistor 21 off.

Therefore, only a voltage generator supplying a small amount of voltage, such as a cell, can serve as the internal power supply 80.

In other words, in the case where the internal power supply 80 is used to keep the transistor 21 off as illustrated in FIG. 11A, the capacitance of the internal power supply 80 can be made lower than in the case where the internal power supply 80 is provided to perform data processing or retain the data in all the volatile memories, thereby downsizing the device.

It is preferable that the internal power supply 80 be shared by a plurality of memory cells in view of downsizing of the device.

Figure 11B:
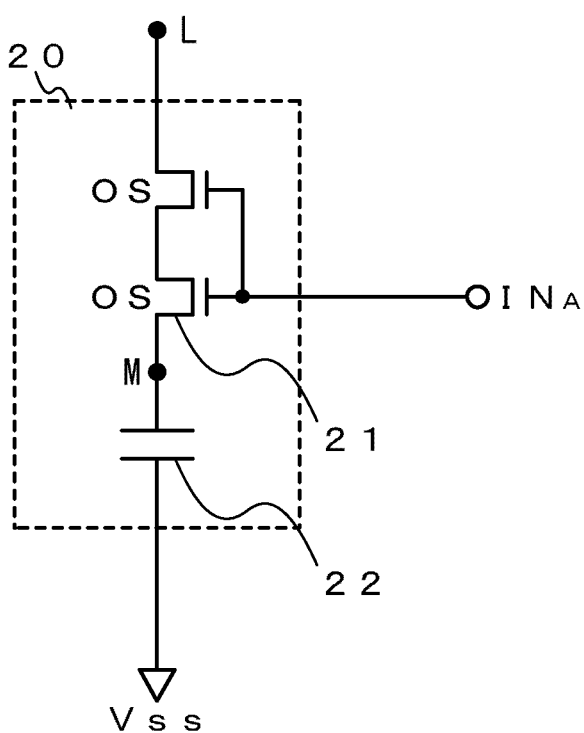

Moreover, it is preferable that a plurality of transistors be connected in series as illustrated in FIG. 11B.

Connecting a plurality of transistors in series means electrically connecting the gates of a plurality of transistors and electrically connecting sources or drains of the plurality of transistors so that the channel formation regions of the plurality of transistors are connected in series.

Connecting a plurality of transistors in series dramatically increases the resistance between L and M in FIG. 11B. Thus, the leakage current can be dramatically reduced even when the transistor 21 is a normally-on transistor.

Consequently, the retention time of the memory 20 can be extended.

Therefore, when the transistor 21 is a normally-on transistor, the structure where a plurality of transistors is connected in series may be employed instead of the structure where the internal power supply 80 is provided.

Note that both the structure where the internal power supply 80 is provided (FIG. 11A) and the structure where a plurality of transistors is connected in series (FIG. 11B) may be employed.

Although the case where the structure in FIG. 11A and/or the structure in FIG. 11B is used when the transistor 21 is a normally-on transistor has been described, the structure in FIG. 11A and/or the structure in FIG. 11B may be used also when the transistor 21 is a normally-off transistor.

Using the structure in FIG. 11A and/or the structure in FIG. 11B when the transistor 21 is a normally-off transistor is preferable because it reduces the leakage current during power down (or supply voltage drop).

The contents of this embodiment or part thereof can be implemented in combination with any of the other embodiments and examples.

EXAMPLE 1

A transistor including an oxide semiconductor containing In, Sn, and Zn can have favorable characteristics by forming the oxide semiconductor while heating a substrate or by heat treatment after forming an oxide semiconductor film.

Note that each of In, Sn, and Zn is preferably contained at greater than or equal to 5 at. %.

By heating the substrate after forming the oxide semiconductor film containing In, Sn, and Zn, the field-effect mobility of the transistor can be improved.

The threshold voltage of an n-channel transistor can be shifted in the positive direction.

When the threshold voltage of the n-channel transistor is shifted in the positive direction, an absolute value of voltage for holding an off state of the n-channel transistor can be decreased, and power consumption can be reduced.

Further, when the threshold voltage of the n-channel transistor is shifted in the positive direction, and the threshold voltage is greater than or equal to 0 V, a normally-off transistor can be formed.

Characteristics of transistors including the oxide semiconductor containing In, Sn, and Zn are described below.

(Common Conditions for Samples A to C)

An oxide semiconductor layer was formed over a substrate to have a thickness of 15 nm under the following conditions: a target with an In:Sn:Zn composition ratio (atomic ratio) of 1:1:1 was used; the gas flow rate was $Ar/O_2=6/9$ sccm; the deposition pressure was 0.4 Pa; and the deposition power was 100 W.

Next, the oxide semiconductor layer was etched into an island shape.

Then, a tungsten layer was formed over the oxide semiconductor layer to have a thickness of 50 nm, and was etched, so that a source electrode and a drain electrode were formed.

Next, a silicon oxynitride (SiON) film was formed so as to have a thickness of 100 nm, using a silane gas ($SiH_4$) and dinitrogen monoxide ($N_2O$) by a plasma CVD method, so that a gate insulating layer was formed.

Then, a gate electrode was formed in the following manner: a tantalum nitride film was formed to have a thickness of 15 nm; a tungsten film was formed to have a thickness of 135 nm; and these films were etched.

After that, a silicon oxynitride (SiON) film with a thickness of 300 nm was formed by a plasma CVD method and a polyimide film with a thickness of 1.5 μm was formed, so that an interlayer insulating film was formed.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

As described above, a semiconductor device having a transistor was formed.

(Sample A)

In Sample A, heating was not performed to the substrate during the deposition of the oxide semiconductor layer.

Further, in Sample A, heat treatment was not performed after the deposition of the oxide semiconductor layer before the etching of the oxide semiconductor layer.

(Sample B)

In Sample B, the oxide semiconductor layer was formed with the substrate heated at 200° C.

Further, in Sample B, heat treatment was not performed after the deposition of the oxide semiconductor layer before the etching of the oxide semiconductor layer.

The substrate was heated while the oxide semiconductor layer was formed in order to remove hydrogen serving as a donor in the oxide semiconductor layer.

(Sample C)

In Sample C, the oxide semiconductor layer was formed with the substrate heated at 200° C.

Further, in Sample C, heat treatment in a nitrogen atmosphere was performed at 650° C. for 1 hour and then heat treatment in an oxygen atmosphere was performed at 650° C. for 1 hour after the oxide semiconductor layer was formed before the oxide semiconductor layer was etched.

The reason why the heat treatment was performed at 650° C. in a nitrogen atmosphere for 1 hour is because hydrogen that serves as a donor in the oxide semiconductor layer is removed.

Here, oxygen is also released by the heat treatment for removing hydrogen that serves as a donor in the oxide semiconductor layer, and an oxygen vacancy which serves as a carrier in the oxide semiconductor layer is generated.

Thus, an effect of reducing oxygen vacancies was tried to be obtained by performing heat treatment at 650° C. in an oxygen atmosphere for 1 hour.

(Characteristics of Transistors of Samples A to C)

FIG. 17A shows initial characteristics of the transistor of Sample A.

FIG. 17B shows initial characteristics of the transistor of Sample B.

FIG. 17C shows initial characteristics of the transistor of Sample C.

The field-effect mobility of the transistor of Sample A was 18.8 $cm^2$/Vsec.

The field-effect mobility of the transistor of Sample B was 32.2 $cm^2$/Vsec.

The field-effect mobility of the transistor of Sample C was 34.5 $cm^2$/Vsec.

According to observation of cross sections of oxide semiconductor layers which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the sample, the substrate of which was heated during deposition, had a non-crystalline portion and a crystalline portion, and the orientation of the crystalline portion was aligned in the c-axis direction.

In a conventional polycrystal, the orientation of the crystalline portion is not aligned. Thus, it can be said that the sample, the substrate of which was heated during deposition, has a novel structure.

Figure 12A:
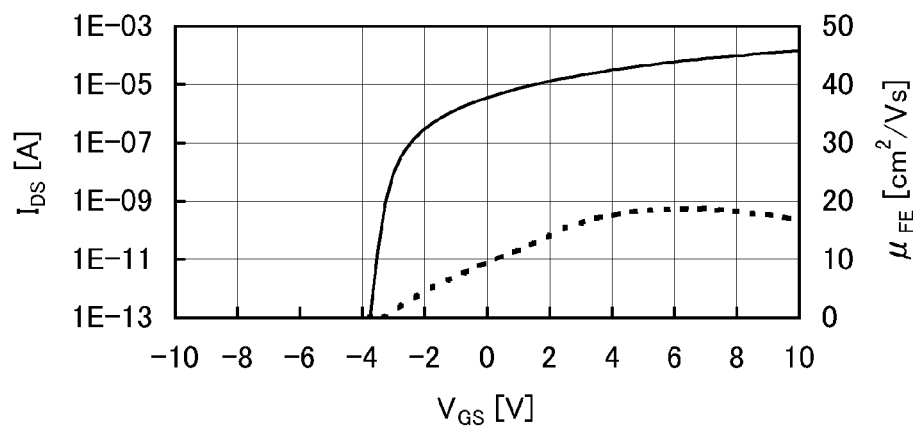
FIGS. 12A to 12C each illustrate the initial characteristics of a sample in Example 1.
Figure 12B:
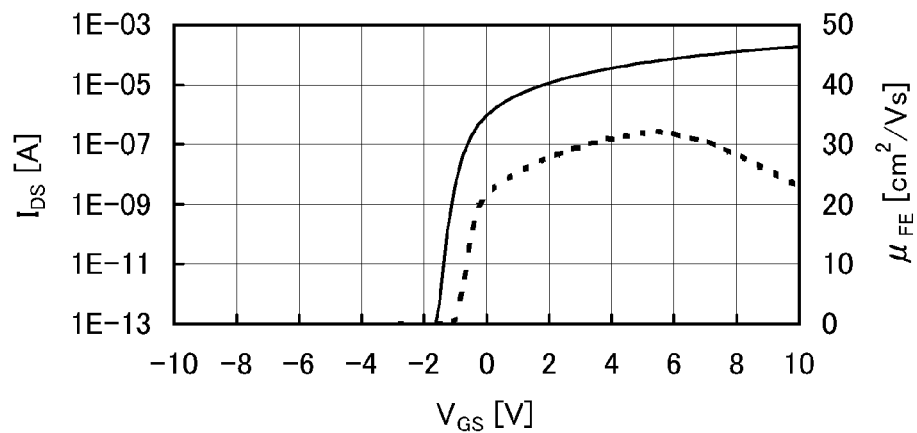
Figure 12C:
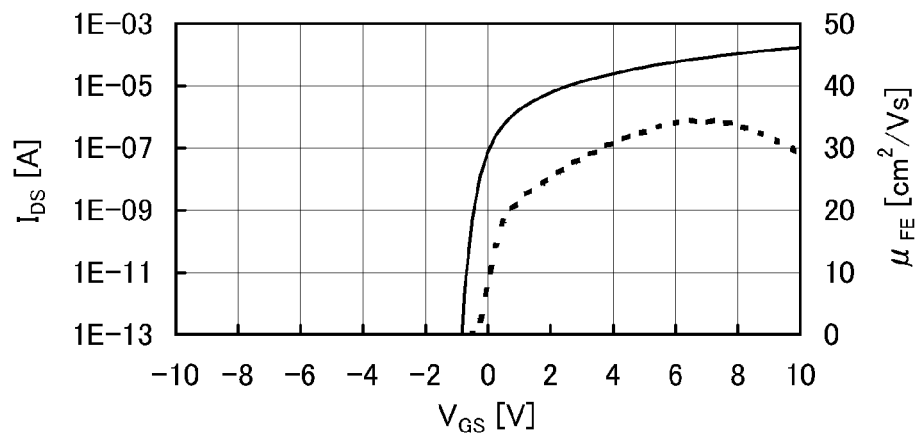

Comparison between FIGS. 12A to 12C shows that heat treatment performed on the substrate during or after deposition can remove a hydrogen element serving as a donor, so that the threshold voltage of the n-channel transistor can be shifted in the positive direction.

That is, the threshold voltage of Sample B, the substrate of which was subjected to heating during deposition, is shifted in the positive direction more than the threshold voltage of Sample A, the substrate of which was not subjected to heating during deposition.

In addition, by comparing Sample B and Sample C, substrates of which were heated during deposition, it is found that the threshold voltage of Sample C on which heat treatment was performed after deposition is shifted in the positive direction more than the threshold voltage of Sample B on which heat treatment was not performed after deposition.

As the temperature of the heat treatment is higher, a light element such as hydrogen is easily removed; therefore, as the temperature of the heat treatment is higher, hydrogen is easily removed.

Accordingly, it can be considered that the threshold voltage can be shifted more in the positive direction by further increasing the temperature of heat treatment during or after the deposition.

(Results of the Gate BT Stress Test of Sample B and Sample C)

The gate BT stress test was performed on Sample B (without heat treatment after deposition) and Sample C (with heat treatment after deposition).

First, $V_{gs}$–$I_{ds}$ characteristics of the transistors were measured at a substrate temperature of 25° C. and $V_{ds}$ of 10 V to measure characteristics of the transistors before heating and high positive voltage application.

Then, the substrate temperature was set to 150° C. and $V_{ds}$ was set to 0.1 V.

After that, 20 V was applied as $V_{gs}$ to the gate insulating film, and was kept for 1 hour.

Next, $V_{gs}$ was set to 0 V.

Then, $V_{gs}$–$I_{ds}$ characteristics of the transistors were measured at a substrate temperature of 25° C. and $V_{ds}$ of 10 V, whereby the characteristics of the transistors after heating and high positive voltage application were measured.

As described above, to compare the characteristics of the transistor before and after heating and high positive voltage application is referred to as a positive BT test.

In a similar manner, $V_{gs}$–$I_{ds}$ characteristics of the transistors were measured at a substrate temperature of 25° C. and $V_{ds}$ of 10 V to measure characteristics of the transistors before heating and high negative voltage application.

Then, the substrate temperature was set to 150° C. and $V_{ds}$ was set to 0.1 V.

Next, −20 V was applied as $V_{gs}$ to the gate insulating film, and was kept for 1 hour.

Next, $V_{gs}$ was set to 0 V.

Then, $V_{gs}$–$I_{ds}$ characteristics of the transistors were measured at a substrate temperature of 25° C. and $V_{ds}$ of 10 V, whereby the characteristics of the transistors after heating and high negative voltage application were measured.

As described above, to compare the characteristics of the transistor before and after heating and high negative voltage application is referred to as a negative BT test.

Figure 13A:
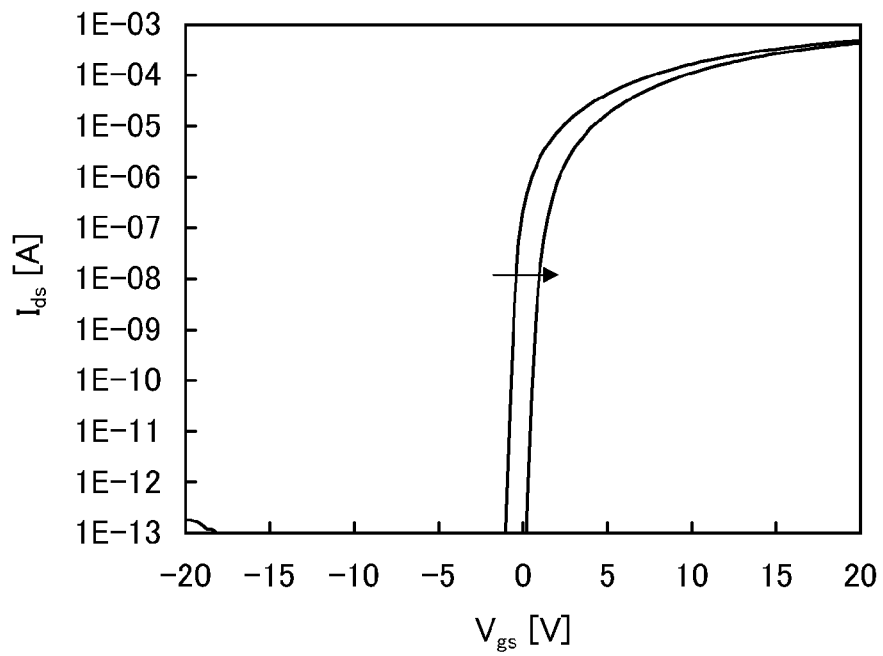
FIGS. 13A and 13B each illustrate the positive BT test results of a sample in Example 1.
Figure 13B:
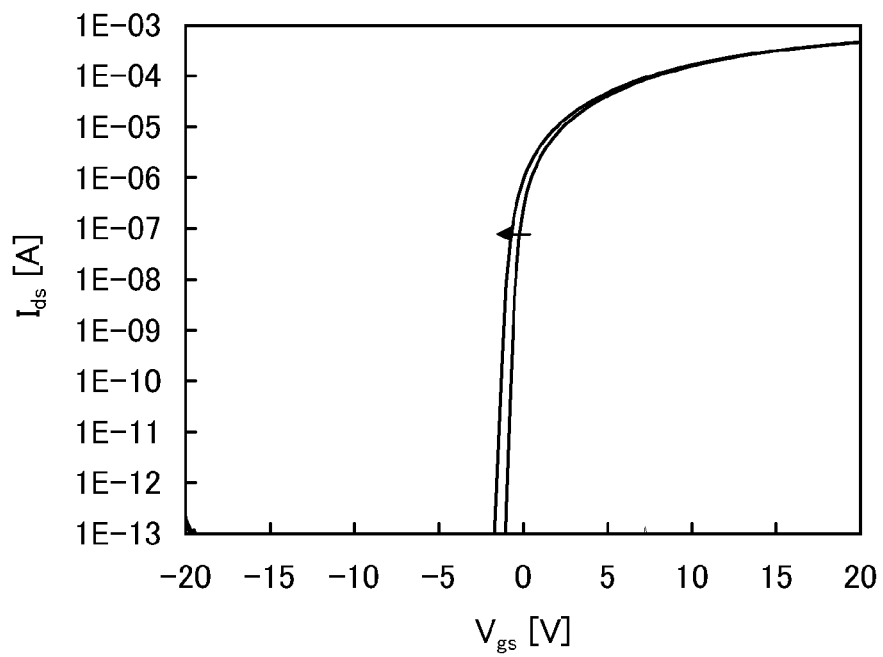

FIG. 13A shows results of the positive BT test of Sample B, and FIG. 13B shows results of the negative BT test of Sample B.

Figure 14A:
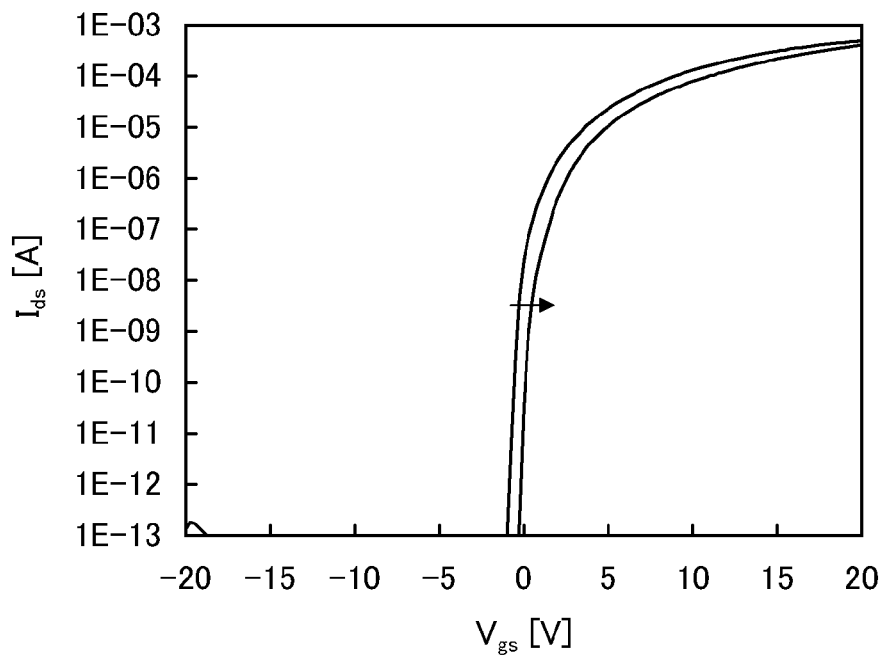
FIGS. 14A and 14B each illustrate the negative BT test results of a sample in Example 1.
Figure 14B:
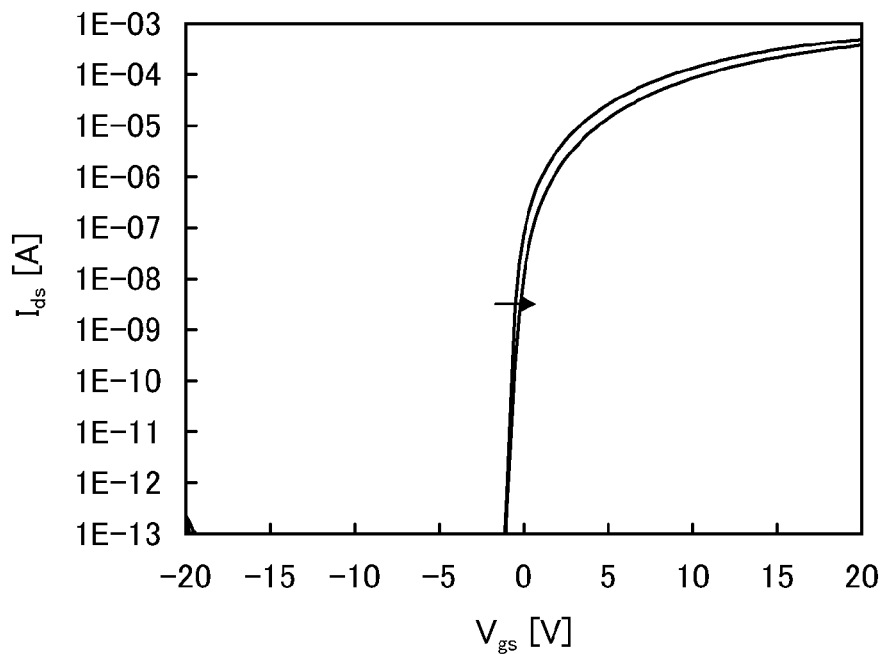

FIG. 14A shows results of the positive BT test of Sample C, and FIG. 14B shows results of the negative BT test of Sample C.

The positive BT test and the negative BT test are tests used to determine deterioration of the transistors; it is found that the threshold voltage can be positively shifted by at least the positive BT tests with reference to FIG. 13A and FIG. 14A.

In particular, it is found in FIG. 13A that the transistor became normally-off when the positive BT test was performed.

Accordingly, when the positive BT test as well as the heat treatment at the time of manufacture of the transistors was performed, a positive shift of the threshold voltage could be promoted and a normally-off transistor could be formed.

Figure 15:
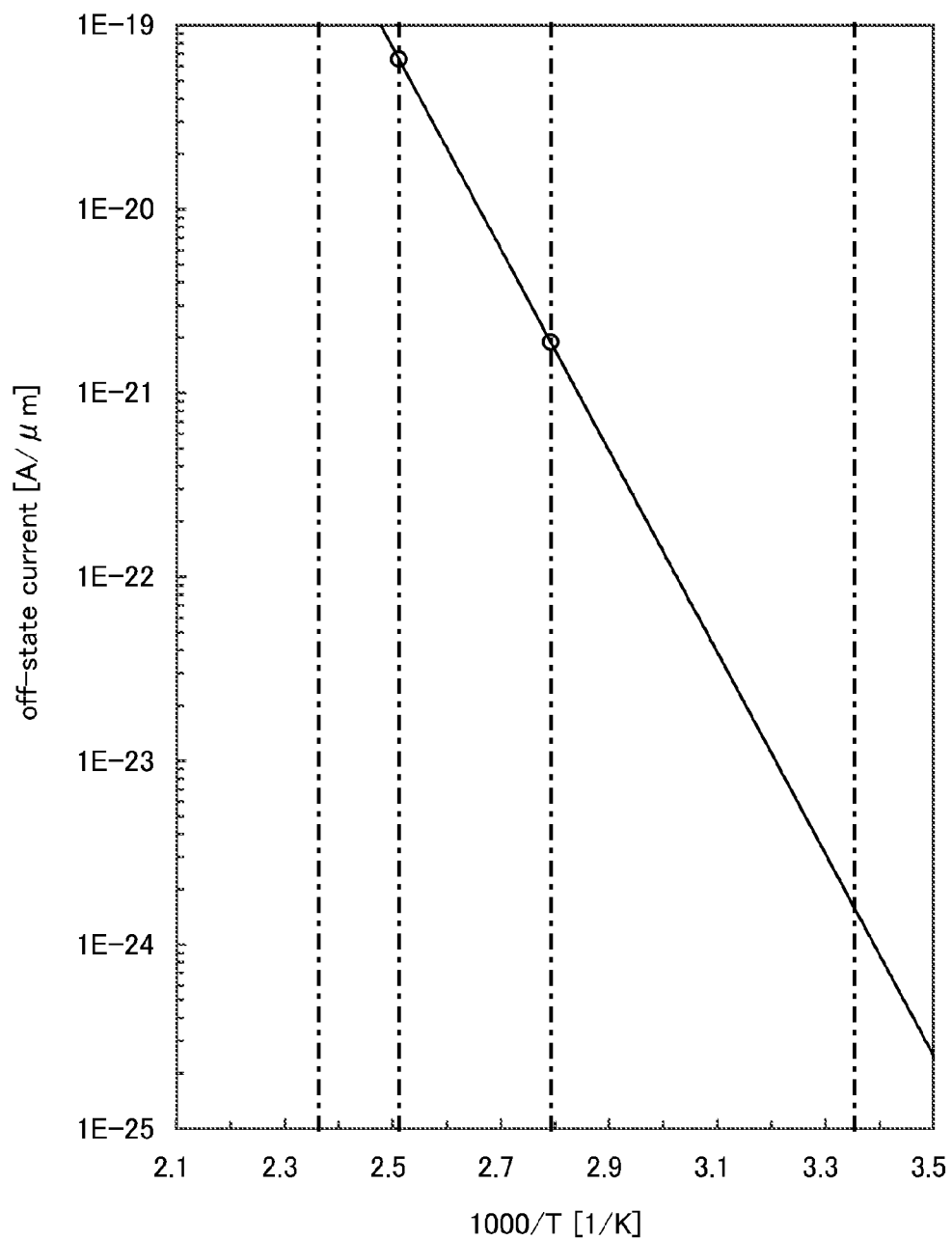
FIG. 15 illustrates a relation between an off-state current and a substrate temperature during measurement.

FIG. 15 shows a relation between the off-state current of the transistor of Sample A and the inverse of the substrate temperature (absolute temperature) at measurement.

Here, the horizontal axis represents a value (1000/T) obtained by multiplying an inverse of the substrate temperature at measurement by 1000.

Note that the off-state current per a channel width of 1 μm is shown in FIG. 15.

The off-state current was less than or equal to $1\times10^{-19}$ A when the substrate temperature was 125° C. (1000/T was about 2.51).

The off-state current was less than or equal to $1\times10^{-20}$ A when the substrate temperature was 85° C. (1000/T was about 2.79).

In other words, it is found that extremely small off-state current was obtained as compared to a transistor including a silicon semiconductor.

The off-state current is decreased as the temperature is lower; therefore, it is clear that smaller off-state current is obtained at room temperature.

This application is based on Japanese Patent Application serial no. 2011-112797 filed with Japan Patent Office on May 19, 2011, the entire contents of which are hereby incorporated by reference.

What is claimed is:

1. A semiconductor device comprising a memory cell including:
    a memory;
    a first transistor including an oxide semiconductor layer;
    a first capacitor; and
    a switch,
    wherein an output port of the memory is electrically connected to one terminal of the switch,
    wherein the other terminal of the switch is electrically connected to one of a source and a drain of the first transistor, and
    wherein the other of the source and the drain of the first transistor is electrically connected to the first capacitor.

2. The semiconductor device according to claim 1, wherein the memory is a volatile memory.

3. The semiconductor device according to claim 1,
    wherein the memory comprises a second capacitor and a second transistor, and
    wherein the second transistor includes a semiconductor including silicon.

4. The semiconductor device according to claim 1, wherein the switch is a data collision prevention switch.

5. The semiconductor device according to claim 1,
    wherein the switch includes an oxide semiconductor layer, and
    wherein the oxide semiconductor layer in the first transistor and the oxide semiconductor layer in the switch are formed of a common layer.

6. The semiconductor device according to claim 1, further comprising a pipeline circuit,
    wherein the pipeline circuit comprises a first stage and a second stage, and
    wherein the memory cell is provided between the first stage and the second stage.

7. A semiconductor device comprising a memory cell including:
a memory;
a first transistor including an oxide semiconductor layer;
a first capacitor;
a second transistor; and
a delay circuit,
wherein an output port of the memory is electrically connected to one of a source and a drain of the second transistor,
wherein the other of the source and the drain of the second transistor is electrically connected to one of a source and a drain of the first transistor,
wherein the other of the source and the drain of the first transistor is electrically connected to the first capacitor,
wherein an input terminal of the delay circuit is electrically connected to a gate of the first transistor, and
wherein an output terminal of the delay circuit is electrically connected to a gate of the second transistor.

8. The semiconductor device according to claim 7, wherein the memory is a volatile memory.

9. The semiconductor device according to claim 7,
wherein the memory comprises a second capacitor and a third transistor, and
wherein the third transistor includes a semiconductor including silicon.

10. The semiconductor device according to claim 7, wherein the second transistor is a data collision prevention switch.

11. The semiconductor device according to claim 7,
wherein the second transistor includes an oxide semiconductor layer, and
wherein the oxide semiconductor layer in the first transistor and the oxide semiconductor layer in the second transistor are formed of a common layer.

12. The semiconductor device according to claim 7, further comprising a pipeline circuit,
wherein the pipeline circuit comprises a first stage and a second stage, and
wherein the memory cell is provided between the first stage and the second stage.

13. The semiconductor device according to claim 1, wherein the oxide semiconductor layer includes at least one of indium and zinc in a channel formation region.

14. The semiconductor device according to claim 7, wherein the oxide semiconductor layer includes at least one of indium and zinc in a channel formation region.

* * * * *